(12) United States Patent
Park

(10) Patent No.: US 10,505,149 B2
(45) Date of Patent: Dec. 10, 2019

(54) DISPLAY DEVICE

(71) Applicant: SAMSUNG DISPLAY CO., LTD., Yongin-si, Gyeonggi-do (KR)

(72) Inventor: Myoung Seo Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/397,201

(22) Filed: Apr. 29, 2019

(65) Prior Publication Data

US 2019/0259974 A1 Aug. 22, 2019

Related U.S. Application Data

(63) Continuation of application No. 15/863,621, filed on Jan. 5, 2018, now Pat. No. 10,340,476.

(30) Foreign Application Priority Data

Mar. 20, 2017 (KR) .................. 10-2017-0034772

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3276* (2013.01); *H01L 51/5228* (2013.01); *H01L 51/5246* (2013.01); *H01L 51/5256* (2013.01); *H01L 51/0097* (2013.01); *H01L 2251/5338* (2013.01)

(58) Field of Classification Search
CPC ..................................... H01L 27/30
See application file for complete search history.

(56) References Cited

U.S. PATENT DOCUMENTS 8,659,224 B1 2/2014 Moon
2014/0145155 A1 5/2014 Park

FOREIGN PATENT DOCUMENTS

| JP | 2011-18686 A | 1/2011 |
| JP | 2011-160729 | 8/2011 |
| KR | 10-1473309 | 12/2014 |
| KR | 10-2016-0027489 | 3/2016 |
| KR | 10-2016-0116240 A | 10/2016 |

*Primary Examiner* — Cheung Lee
(74) *Attorney, Agent, or Firm* — Lewis Roca Rothgerber Christie LLP

(57) ABSTRACT

An electroluminescent device includes a lower structure and a flexible encapsulation multilayer. The lower structure may have an emission area and a peripheral area surrounding the emission area. The flexible encapsulation multilayer may be disposed on the emission area and the peripheral area. The peripheral area may include an inorganic surface portion having a closed shape continuously surrounding the display area and comprising one or more inorganic materials. The flexible encapsulation multilayer may include a lower surface comprising only one or more inorganic materials. The lower surface of flexible encapsulation multilayer may be in in direction contact with the inorganic surface portion.

29 Claims, 29 Drawing Sheets

DISPLAY DEVICE

CROSS-REFERENCE TO RELATED APPLICATION

This application is a continuation of U.S. patent application Ser. No. 15/863,621, filed Jan. 5, 2018, which claims priority to and the benefit of Korean Patent Application No. 10-2017-0034772, filed Mar. 20, 2017, the entire content of both of which is incorporated herein by reference.

BACKGROUND

1. Field

One or more aspects of example embodiments of the present invention relate to an electroluminescent device.

2. Description of the Related Art

An organic light-emitting display includes an electroluminescent unit including a hole injection electrode, an electron injection electrode, and an organic light-emitting layer formed between the hole injection electrode and the electron injection electrode. The organic light-emitting display is a self-emission type display device that emits light when excitons, which are generated from the organic light-emitting layer by the combination of holes injected from the hole injection electrode and electrons injected from the electron injection electrode, transition from an excited state to a ground state.

Because the organic light-emitting display device, which is a self-emission type display device, does not require an additional light source, it may be driven at a low voltage, may be a lightweight and thin type display device, and may have high quality characteristics, such as a wide viewing angle, high contrast, and rapid response speed. Therefore, the organic light-emitting display device is attracting considerable attention as a next-generation display device. However, because the electroluminescent unit may be deteriorated by external moisture and/or oxygen, it is desirable to prevent or block external moisture, oxygen, and/or the like from penetrating into the electroluminescent unit.

The above information disclosed in this Background section is for enhancement of understanding of the background of the invention, and therefore, it may contain information that does not constitute prior art.

SUMMARY

One or more aspects of the present invention provide are directed toward an electroluminescent device having improved encapsulating characteristics.

According one or more aspects of the present invention, an electroluminescent device may comprise a lower structure and a flexible encapsulation multilayer. The lower structure may have an emission area and a peripheral area surrounding the emission area. The lower structure may comprise an inorganic insulating film, an insulation film located on the inorganic insulating film, and an electroluminescent unit having a lower electrode disposed on the insulation film, an intermediate film disposed on the lower electrode, and an upper electrode disposed on the intermediate film. The flexible encapsulation multilayer may be disposed on the emission area and the peripheral area, and may include at least three layers. The peripheral area may include an inorganic surface portion substantially surrounding the emission area, may be located outside the upper electrode at a planar view, and may comprise only one or more inorganic materials. The flexible encapsulation multilayer may include a lower surface comprising only one or more inorganic materials. An entire of the inorganic surface portion may directly contact the lower surface of the flexible encapsulation multilayer. The lower structure may include a lower encapsulation inorganic film horizontally expanding under a surface of the lower structure to vertically correspond to the emission area and the peripheral area. A portion disposed between the lower encapsulation inorganic film and the entire of the inorganic surface portion may comprise only one or more inorganic materials.

In one or more example embodiments, the inorganic surface portion may include a first region having a first average width and a second region having a second average width, and the first average width and the second average width may be substantially different from each other.

In one or more example embodiments, the first region and the second region may be located at the same side of the lower structure.

In one or more example embodiments, the first region of the inorganic surface portion may entirely correspond to a first side of the lower structure, and the second region of the inorganic surface portion may entirely correspond to a second side of the lower structure different from the first side of the lower structure.

In one or more example embodiments, the first region may have a first part having a third average width relatively smaller than the first average width and a second part having a fourth average width relatively larger than the first average width.

In one or more example embodiments, the lower electrode may be disposed directly on a top surface of the insulation film, and the entire of the inorganic surface portion may be disposed relatively lower than the top surface of the insulation film. The inorganic surface portion may have at least a region including a plurality of inorganic surface branches spaced from each other. The peripheral area may include an organic surface portion which is disposed between the inorganic surface branches. The organic surface portion may comprise an organic material and may substantially surround the emission area. The organic surface portion may be substantially surrounded at a planar view by an interface where the lower surface of the flexible encapsulation multilayer directly contacts the inorganic surface portion. The inorganic surface branches may include an outer inorganic surface branch located relatively outer than the organic surface portion and an inner inorganic surface branch located relatively inner than the organic surface portion. The lower structure may further comprise a bus wire extending on a top surface of the inorganic insulating film along a periphery of the emission area, and an auxiliary upper electrode which extends on side and top surfaces of the insulation film along the periphery of the emission area to electrically contact both a top surface of the bus wire and a bottom surface of the upper electrode. The inner inorganic surface branch may include at least a portion of a top surface of the auxiliary upper electrode to have a height relatively larger than a height of the outer inorganic surface branch. A portion of a surface of the bus wire may directly contact the lower surface of the flexible encapsulation multilayer, and the portion of the surface of the bus wire may be relatively farther than the organic surface portion from the emission area.

In one or more example embodiments, the electroluminescent device may be capable of being flexed, bent, folded, rolled, or stretched by an end user.

In one or more example embodiments, the inorganic surface portion may include at least two stepped surface portions each including a top surface portion of the inorganic insulating film, a side surface portion of the bus wire, and a top surface portion of the bus wire. The bus wire may have an outer edge portion and an inner edge portion opposite to the outer edge portion. The outer edge portion of the bus wire may be relatively farther than the inner edge portion of the bus wire from the emission area and may be located under the bottom surface of the flexible encapsulation multilayer. The outer edge portion of the bus wire may be not in direct contact with the bottom surface of the flexible encapsulation multilayer.

In one or more example embodiments, the inorganic surface portion may further include at least two stepped surface portions each including a top surface portion of the inorganic insulating film, a side surface portion of the auxiliary upper electrode, and a top surface portion of the auxiliary upper electrode. The auxiliary upper electrode may have an outer edge portion and an inner edge portion opposite to the outer edge portion. The outer edge portion of the auxiliary upper electrode may be relatively farther than the inner edge portion of the auxiliary upper electrode from the emission area and may be located under the bottom surface of the flexible encapsulation multilayer. The outer edge portion of the auxiliary upper electrode may be not in direct contact with the bottom surface of the flexible encapsulation multilayer.

In one or more example embodiments, the inorganic surface portion may further include at least two stepped surface portions each including a top surface portion of the bus wire, a side surface portion of the auxiliary upper electrode, and a top surface portion of the auxiliary upper electrode. The auxiliary upper electrode may have an outer edge portion and an inner edge portion opposite to the outer edge portion. The outer edge portion of the auxiliary upper electrode may be relatively farther than the inner edge portion of the auxiliary upper electrode from the emission area. The outer edge portion of the auxiliary upper electrode may be located under the bottom surface of the flexible encapsulation multilayer and may be not in direct contact with the bottom surface of the flexible encapsulation multilayer.

In one or more example embodiments, the inorganic surface portion may further include at least two stepped surface portions each including a top surface portion of the inorganic insulating film, a side surface portion of the auxiliary upper electrode, and a top surface portion of the auxiliary upper electrode. The inorganic surface portion may further include at least two stepped surface portions each including a top surface portion of the bus wire, a side surface portion of the auxiliary upper electrode, and a top surface portion of the auxiliary upper electrode. The auxiliary upper electrode may have an outer edge portion and an inner edge portion opposite to the outer edge portion. The outer edge portion of the auxiliary upper electrode may be relatively farther than the inner edge portion of the auxiliary upper electrode from the emission area. The outer edge portion of the auxiliary upper electrode may be located under the bottom surface of the flexible encapsulation multilayer and may be not in direct contact with the bottom surface of the flexible encapsulation multilayer.

In one or more example embodiments, the portion of the surface of the bus wire, which directly contacts the lower surface of the flexible encapsulation multilayer, may be included in the outer inorganic surface branch.

In one or more example embodiments, the organic surface portion may have a shape opened by an opening to discontinuously surround the emission area. The first region of the inorganic surface portion may entirely correspond to a first side of the lower structure at which the opening is disposed. The second region of the inorganic surface portion may entirely correspond to a second side of the lower structure at which the opening is not disposed. The first average width of the first region may be relatively larger than the second average width of the second region.

In one or more example embodiments, the peripheral area may include an inorganic structure having an edge having a lateral surface and an upper surface. The inorganic surface portion may include the lateral and upper surfaces of the edge. The lateral and upper surfaces of the edge may directly contact the flexible encapsulation multilayer. The edge may extend from an outer edge of the inorganic surface portion to an inner edge of the inorganic surface portion located opposite to the outer edge of the inorganic surface portion. The lateral surface of the edge may include at least two independently selected from the group consisting of a convex portion, a concave portion, an angled portion, a curved portion, and a portion extending substantially along a direction in which the inorganic surface portion extends.

In one or more example embodiments, the inorganic structure may include a first inorganic film and a second inorganic film disposed on the first inorganic film. A hardness of the second inorganic film may be relatively larger than a hardness of the first inorganic film.

In one or more example embodiments, the peripheral area may include a conductive film providing the electroluminescent unit with an electrical signal, and having a hole which penetrates the conductive film, which is located inward from an inner edge of the inorganic surface portion, and which is an alignment mark. The conductive film may be an auxiliary upper electrode extending along a periphery of the emission area, and electrically contacting the upper electrode.

In one or more example embodiments, the inorganic surface portion may have at least one recess. The recess may be a hole formed through a first inorganic layer on a second inorganic layer such that a top surface of the second inorganic layer is exposed through the hole and becomes a bottom surface of the recess. The first inorganic layer may comprise only one or more inorganic films, and the second inorganic layer may comprise only one or more inorganic films.

In one or more example embodiments, the recess may have a protrusion having a height no more than a depth of the recess.

In one or more example embodiments, at least two of the recesses may have substantially different shapes in a plan view.

BRIEF DESCRIPTION OF THE DRAWINGS

The above and other aspects and features of the present invention will become more apparent to those skilled in the art from the following detailed description of the example embodiments with reference to the accompanying drawings, in which.

DETAILED DESCRIPTION

Figure 1:
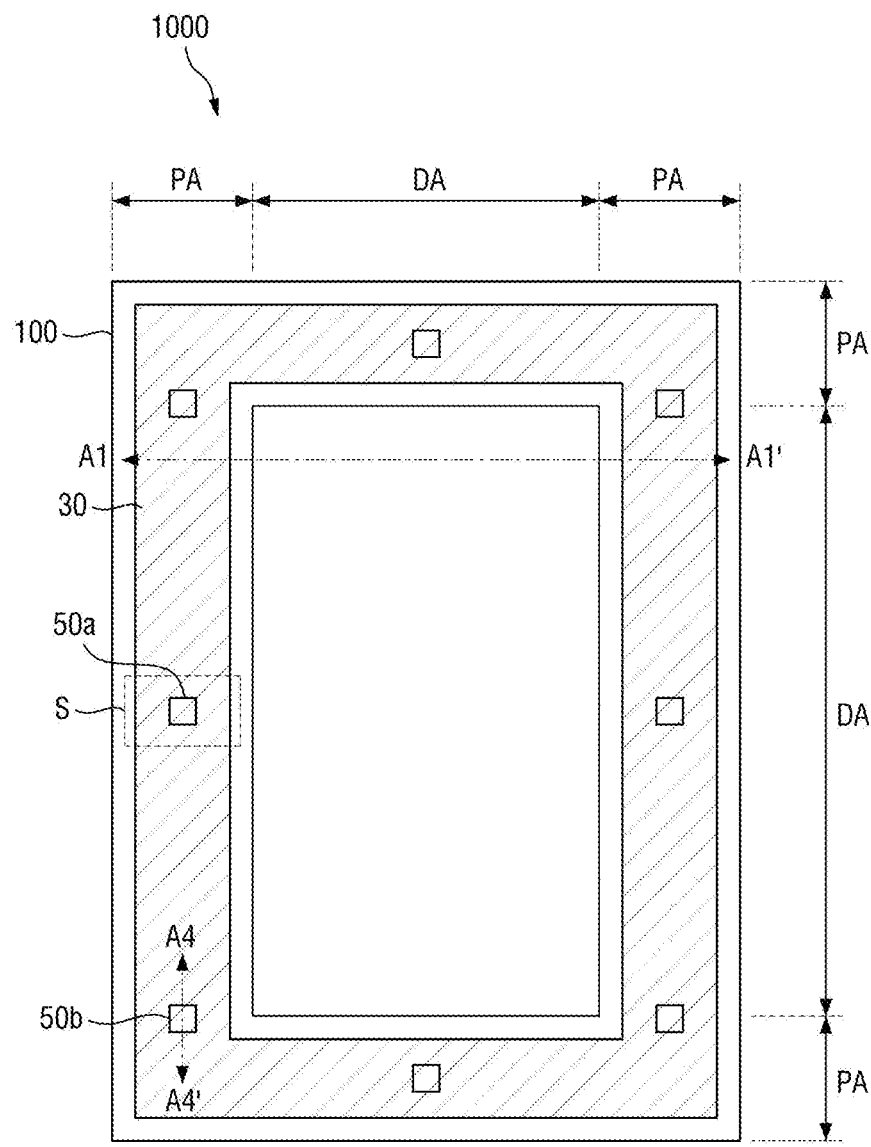
FIG. 1 is a schematic plan view showing a display device according to an example embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated example embodiments herein. Rather, these example embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present The terminology used herein is for the purpose of describing particular example embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing example embodiments of the present invention refers to "one or more example embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The expression "it comprises only an inorganic material" refers to that it comprises only one or more inorganic materials, not that it comprises only one inorganic material. Further, the expression "it comprises only an organic material" refers to that it comprises only one or more organic materials, not that it comprises only one organic material. The term of "'element' portion" refers to at least a portion of the entire 'element.' For example, the term of "an inorganic surface portion" refers to at least a portion of the entire inorganic surface. Counting the number of 'element' portions is possible when the 'element' portions are separated from each other in a plan view such that merging the 'element' portions into one 'element' portion is not possible.

Figure 2:
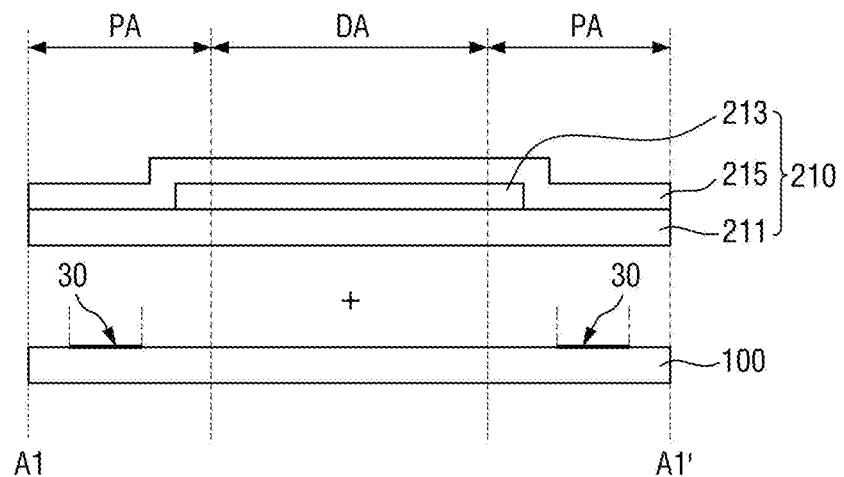
FIG. 2 is a sectional view taken along the line A1-A1' of FIG. 1.
Figure 3:
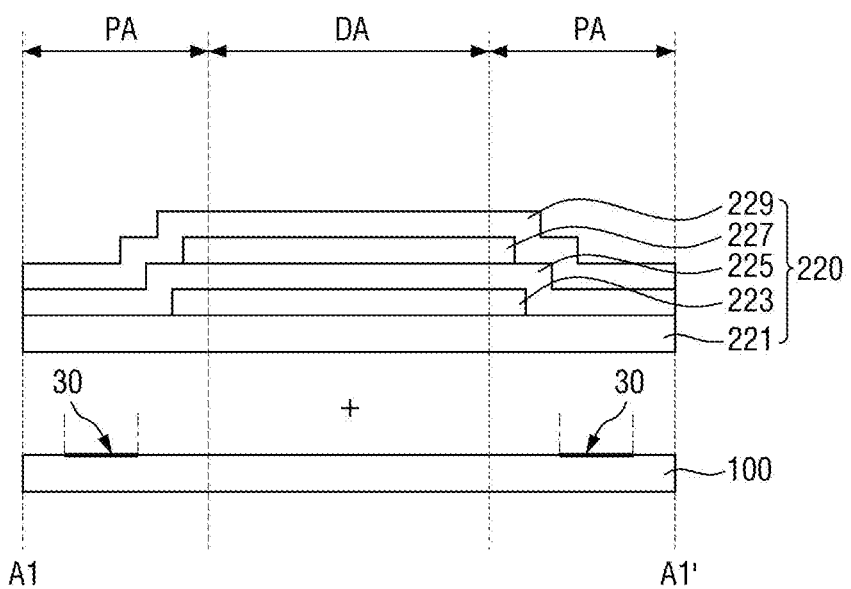
FIG. 3 is a sectional view showing a modified example of the flexible encapsulation multilayer in the display device of FIG. 2.
Figure 4:
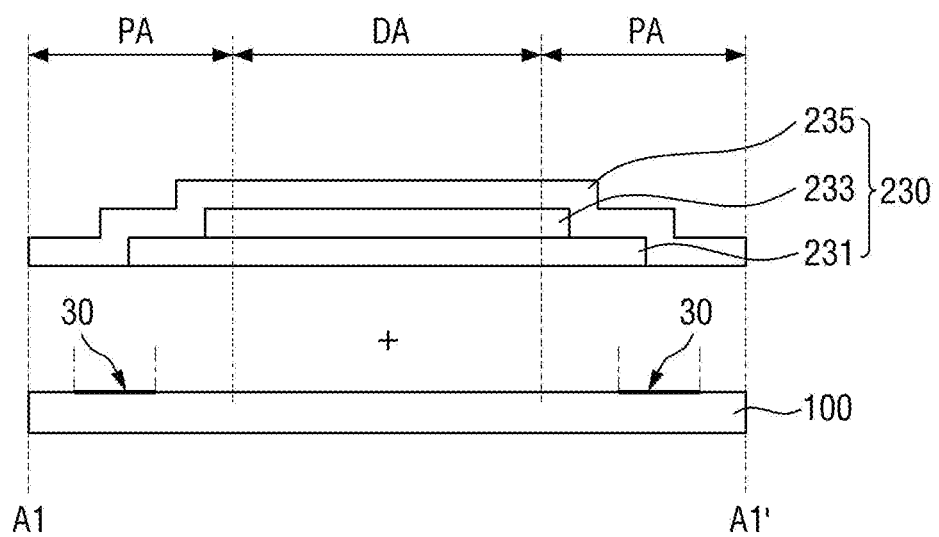
FIG. 4 is a sectional view showing another modified example of the flexible encapsulation multilayer in the display device of FIG. 2.
Figure 5:
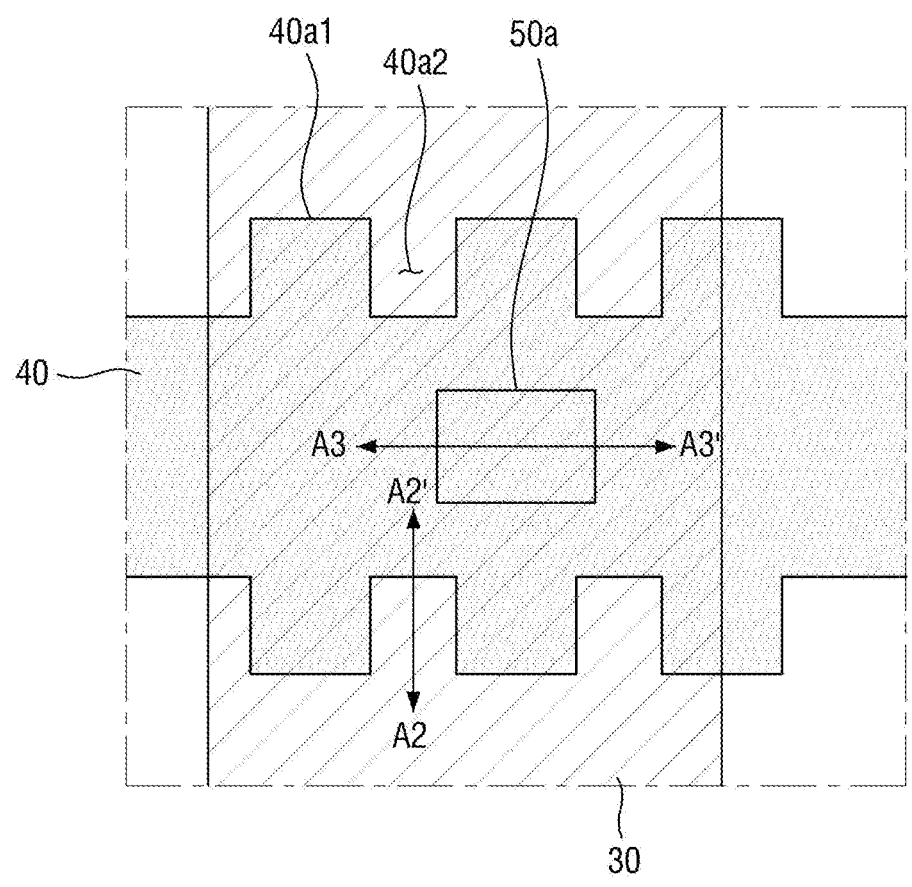
FIG. 5 is an enlarged view of the area S of FIG. 1.
Figure 6:
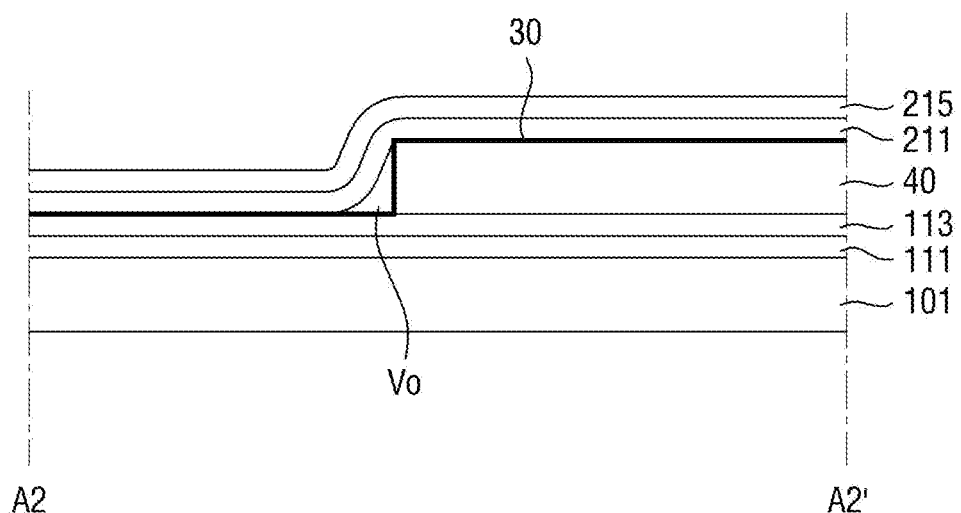
FIG. 6 is a sectional view taken along the line A2-A2' of FIG. 5.
Figure 7:
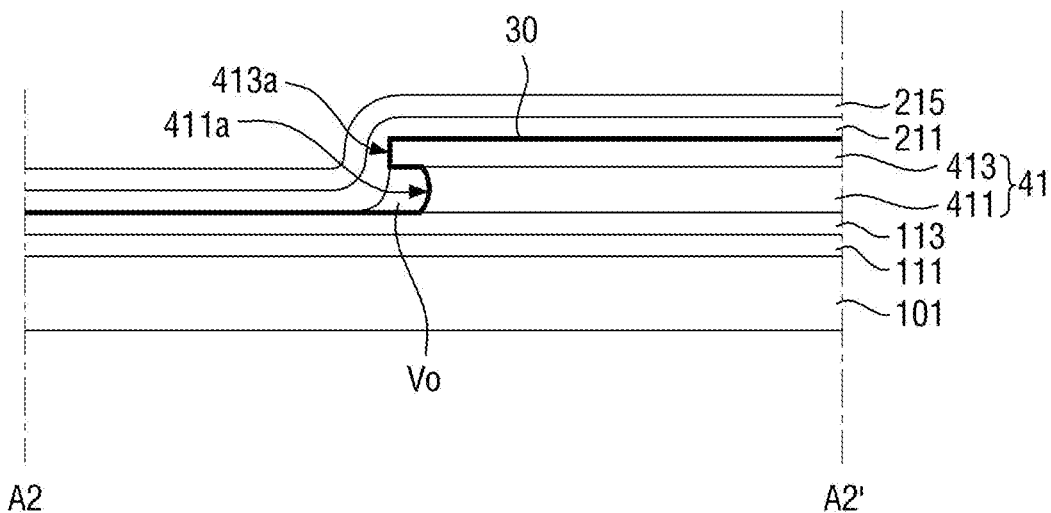
FIG. 7 is a sectional view showing a modified example of FIG. 6.
Figure 8:
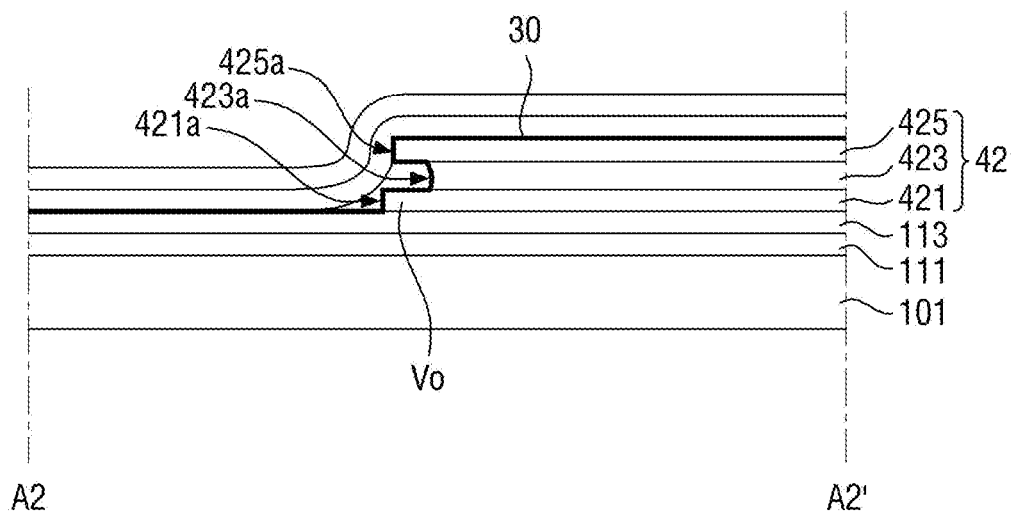
FIG. 8 is a sectional view showing another modified example of FIG. 6.
Figure 9:
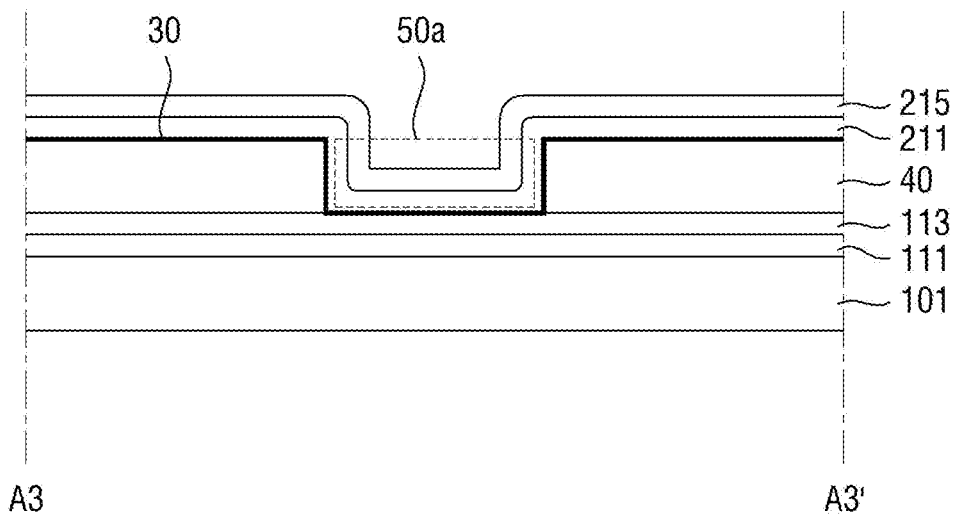
FIG. 9 is a sectional view taken along the line A3-A3' of FIG. 5.
Figure 10:
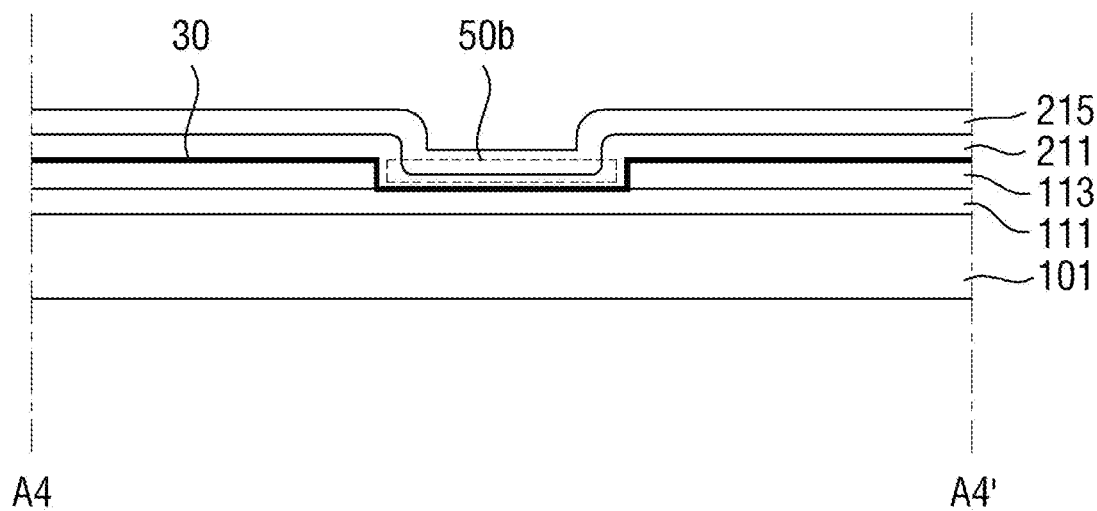
FIG. 10 is a sectional view taken along the line A4-A4' of FIG. 1.

Hereinafter, example embodiments of the present invention will be described with reference to the attached drawings FIG. 1 is a schematic plan view showing a display device according to an example embodiment of the present invention. FIG. 2 is a sectional view taken along the line A1-A1' of FIG. 1, in which a lower structure and a flexible encapsulation multilayer are separated from each other. FIG. 3 is a sectional view showing a modified example of the flexible encapsulation multilayer in the display device of FIG. 2. FIG. 4 is a sectional view showing another modified example of the flexible encapsulation multilayer in the display device of FIG. 2. FIG. 5 is an enlarged view of the area S of FIG. 1. FIG. 6 is a sectional view taken along the line A2-A2' of FIG. 5. FIG. 7 is a sectional view showing a modified example of FIG. 6. FIG. 8 is a sectional view showing another modified example of FIG. 6. FIG. 9 is a sectional view taken along the line A3-A3' of FIG. 5. FIG. 10 is a sectional view taken along the line A4-A4' of FIG. 1.

Referring to FIGS. 1 to 4, a display device 1000 according to an example embodiment of the present invention, as shown in FIGS. 1 and 2, includes a lower structure 100 and a flexible encapsulation multilayer 210 disposed on the lower structure 100.

The lower structure 100 is a display substrate including elements (or components) for implementing (or displaying) an image, such as an electroluminescent unit, and includes a display area DA for displaying an image and a peripheral area PA surrounding (e.g., located around) the display area DA. In one or more example embodiments, the lower structure 100 may be any one of a bendable display substrate, a foldable display substrate, a rollable display substrate, a stretchable display substrate, and a flexible display substrate.

The peripheral area PA of the lower structure 100 includes an inorganic surface portion 30. The inorganic surface portion 30 refers to a portion of the surface of the lower structure 100 facing the flexible encapsulation multilayer 210, which is located at the peripheral area PA, and which comprises only one or more inorganic materials.

The inorganic surface portion 30 may include a surface of an inorganic insulation film, a surface of a conductive inorganic wiring (for example, a metal wiring), or both. The inorganic surface portion 30 included in the peripheral area PA may have a closed shape that surrounds (e.g., continuously surround) the entire display area DA. Illustratively, assuming that the left lower corner of the lower structure 100 is a starting point with reference to FIG. 1, the inorganic surface portion 30 may include a portion extending along a first direction x1, a portion extending along a second direction y1, a portion extending along an opposite direction x2 of the first direction x1, and a portion extending along an opposite direction y2 of the second direction y1, arranged sequentially along the counterclockwise direction, and all of the portions may be continuous.

The flexible encapsulation multilayer 210 is formed on a surface (e.g., an entire surface) of the lower structure 100 to cover both the display area DA and the peripheral area PA. Alternatively, the flexible encapsulation multilayer 210 may be formed on the lower structure 100 to cover the entire display area DA and at least a part (or portion) of the peripheral area PA. The flexible encapsulation multilayer 210 protects an electroluminescent element of the display area DA from external moisture and/or oxygen. The flexible encapsulation multilayer 210 may have at least one sandwich structure in which at least one organic film is disposed between at least two inorganic films. In an exemplary example embodiment, the flexible encapsulation multilayer 210, as shown in FIG. 2, may include a first inorganic film 211, a second inorganic film 215 disposed on the first inorganic film 211, and an organic film 213 disposed between the first inorganic film 211 and the second inorganic film 215. The second inorganic film 215 may entirely cover the organic film 213, and may not cover a lateral surface of the first inorganic film 211.

The first inorganic film 211 and the second inorganic film 215 comprise an inorganic material. The inorganic material may be a metal oxide and/or a metal nitride. For example, the inorganic material may include silicon oxide ($SiO_2$), silicon nitride ($SiN_x$), silicon oxynitride (SiON), aluminum oxide ($Al_2O_3$), titanium oxide ($Ta_2O_5$), hafnium oxide ($HfO_2$), zinc oxide ($ZrO_2$), or a combination thereof. The organic film 213 comprises an organic material. Examples of the organic material may include an acrylic resin, a methacrylic resin, polyisoprene, a vinyl resin, an epoxy resin, a urethane resin, a cellulose resin, a perylene resin, or a combination thereof.

However, the structure of the flexible encapsulation multilayer 210 is not limited thereto.

FIGS. 3 and 4 show modified examples of the flexible encapsulation multilayer 210 of FIG. 2. As shown in FIG. 3, a flexible encapsulation multilayer 220 may include a first inorganic film 221, a first organic film 223 disposed on the first inorganic film 221, a second inorganic film 225 disposed on the first organic film 223 to completely cover the first organic film 223, a second organic film 227 disposed on the second inorganic film 225, and a third inorganic film 229 disposed on the second organic film 227 to completely cover the second organic film 227. As shown in FIG. 3, the second inorganic film 225 may not cover the lateral surface of the first inorganic film 221, and the third inorganic film 229 may not cover the lateral surface of the first inorganic film 221 and the lateral surface of the second inorganic film 225. However, the present invention is not limited thereto, and, in another example embodiment, the third inorganic film 229 may cover the lateral surface of the first inorganic film 221 and the lateral surface of the second inorganic film 225.

As shown in FIG. 4, a flexible encapsulation multilayer 230 may include a first inorganic film 231, an organic film 233 disposed on the first inorganic film 231, and a second inorganic film 235 disposed on the organic film 233. The second inorganic film 235 may completely cover the organic film 233, and may cover the lateral surface of the first inorganic film 231.

All of the flexible encapsulation multilayers 210, 220 and 230, described with reference to FIGS. 2 to 4, have a multilayer structure, and the lower surface facing the lower structure 100 is a lower surface of the first inorganic films 211, 221 and 231. That is, all the lower surfaces of the flexible encapsulation multilayers 210, 220 and 230 comprise only one or more inorganic materials. The lower surface of each of the flexible encapsulation multilayers 210, 220 and 230 comprising only one or more inorganic materials is in direct contact with the above-described inorganic surface portion 30 of the lower structure 100 to form an inorganic-inorganic junction. In other words, the lower surface of each of the flexible encapsulation multilayers 210, 220 and 230 is in direct contact with the inorganic surface portion 30 of the lower structure 100 to form a sealing region, and the sealing region is formed only by one or more inorganic materials.

When an organic material exists in the sealing region, it is difficult to prevent or substantially prevent moisture penetration. On the other hand, in the case of the display device 1000, because the sealing region is formed only by one or more inorganic materials, encapsulating properties may be improved.

Hereinafter, for convenience of explanation, a case where the display device 1000 includes the flexible encapsulation multilayer 210 shown in FIG. 2 will be described in more detail as an example.

Referring to FIGS. 5 to 10, as shown in FIGS. 5 and 6, the peripheral area PA of the lower structure 100 may include a substrate 101, a first lower inorganic film 111 disposed on the substrate 101, a second lower inorganic film 113 disposed on the first lower inorganic film 111, and an inorganic structure 40 disposed on the second lower inorganic film 113.

The substrate 101 may support the entire display device 1000 and maintain rigidity. The substrate 101 may have a flat or substantially flat upper surface, and may comprise a transparent insulating material. The substrate 101 may comprise a flexible material, for example, a plastic material, such as polyether sulfone (PES) and polyacrylate (PAR). On the other hand, the substrate 101 may comprise an opaque material, such as metal and carbon fiber. In order to realize a flexible display device, the substrate 101 may also comprise a plastic material, such as a polyimide (PI) film. However, the present invention is not limited thereto, and the substrate 101 may comprise glass or any suitable material.

The first lower inorganic film 111 is formed on the substrate 101. The first lower inorganic film 111 overlaps at least the display area DA. For example, the first lower inorganic film 111 may be formed under a display element, such as an electroluminescent unit, provided in the display area DA, may be formed adjacent to the display element, or may be formed adjacent to any one of members (or components) provided in the display element.

The first lower inorganic film 111 is formed in the display area DA, and may extend to a part (or portion) of the peripheral area PA. The first lower inorganic film 111 may include any one of a buffer film, a gate insulating film, and/or an interlayer insulating film, which will be described in more detail below, but the present invention is not limited thereto. In addition, the first lower inorganic film 111 may be a metal wiring.

The second lower inorganic film 113 may be formed on the first lower inorganic film 111. Similarly to the first lower inorganic film 111, the second lower inorganic film 113 may be formed in the display area DA, and may extend to a part (or portion) of the peripheral area PA. In one or more example embodiments, the second lower inorganic film 113 may include various inorganic films, as long as it is located on the first lower inorganic film 111. Illustratively, when the first lower inorganic film 111 is a buffer film to be described in more detail later, the second lower inorganic film 113 may be any one of a gate insulating film and an interlayer insulating film, which will be described in more detail later. However, the present invention is not limited thereto, and the second lower inorganic film 113 may include various structures comprising inorganic materials, for example, various metal wirings.

The inorganic structure 40 may be an inorganic insulating film or a conductive inorganic wiring (for example, a metal wiring).

The inorganic structure 40 may be in direct contact with the first inorganic film 211 of the flexible encapsulation multilayer 210.

When viewed from a planar view, an edge of the inorganic structure 40 may include a portion extending from an outer edge OE of the inorganic surface portion 30 to an inner edge IE of the inorganic surface portion 30. Further, the portion of the edge of the inorganic structure 40 may include at least one of a convex portion 40a1 and a concave portion 40a2. As described above, the inorganic structure 40 is in direct contact with the first inorganic film 211 of the flexible encapsulation multilayer 210, and a step is generated by the inorganic structure, so that a void Vo may be formed between the first inorganic film 211 and the inorganic structure 40.

When the inorganic structure 40 extends in the shape of a straight line, the void Vo also grows linearly in many cases. In this case, moisture, oxygen, and/or the like may penetrate into the display device 1000 from the outside through the void Vo.

On the other hand, in the case of the display device 1000, the edge of the inorganic structure 40 includes at least one of the convex portion 40a1 and the concave portion 40a2. Thus, even when the void Vo is formed and grown around the edge of the inorganic structure 40 extending along the first direction x1, the void Vo is reduced or eliminated at the side of the convex portion 40a1 or the concave portion 40a2. Particularly, when a plurality of the convex portions 40a1 or a plurality of the concave portions 40a2 are formed, the void Vo is more reliably reduced or eliminated. Accordingly, the encapsulating reliability in the peripheral area PA may be improved.

The inorganic structure 40 may have a single-layer structure as shown in FIG. 6, but the present invention is not limited thereto.

FIGS. 7 and 8 show modified examples of the inorganic structure 40 of FIG. 6.

Illustratively, as shown in FIG. 7, an inorganic structure 41 may include a first inorganic film 411 disposed on the second lower inorganic film 113 and a second inorganic film 413 disposed on the first inorganic film 411.

In one or more example embodiments, a sidewall 411a of the first inorganic film 411 may have a shape that is inwardly recessed relative to a sidewall 413a of the second inorganic film 413. For example, when the first inorganic film 411 and the second inorganic film 413 are patterned in order to form the inorganic structure 41, in a case where the etching rate of the first inorganic film 411 is relatively faster than the etching rate of the second inorganic film 413 corresponding to an etching solution used in wet etching, the sidewall 411a of the first inorganic film 411 may be recessed inward relative to the sidewall 413a of the second inorganic film 413.

Alternatively, for example, when the first inorganic film 411 and the second inorganic film 413 are patterned by dry etching in order to form the inorganic structure 41, in a case where the hardness of the first inorganic film 411 is relatively lower than the hardness of the second inorganic film 413, the sidewall 411a of the first inorganic film 411 may be recessed inward relative to the sidewall 413a of the second inorganic film 413.

Further, as shown in FIG. 8, an inorganic structure 42 may include a first inorganic film 421 disposed on the second lower inorganic film 113, a second inorganic film 423 disposed on the first inorganic film 421, and a third inorganic film 425 disposed on the second inorganic film 423.

In one or more example embodiments, a sidewall 423a of the second inorganic film 423 may have a shape that is inwardly recessed relative to a sidewall 421a of the first inorganic film 421 and/or a sidewall 425a of the third inorganic film 425. When wet etching is performed in the process of forming the inorganic structure 42, the shape of the inorganic structure 42 may be formed when the etching rate of the second inorganic film 423 corresponding to the etching solution (e.g., an etching liquid) is relatively faster than the etching rate of the first inorganic film 421 and/or the etching rate of the third inorganic film 425.

Further, when dry etching is performed in the process of forming the inorganic structure 42, the above-described shape of the inorganic structure 42 may be realized even when the hardness of the second inorganic film 423 is relatively lower than the hardness of the first inorganic film 421 and/or the hardness of the third inorganic film 425.

FIG. 9 is a sectional view taken along the line A3-A3' of FIG. 5, and FIG. 10 is a sectional view taken along the line A4-A4' of FIG. 1.

Referring to FIG. 9, a first adhesion increasing recess 50a may be formed in the peripheral area PA. In one or more example embodiments, the first adhesion increasing recess 50a may be formed by removing a part (or portion) of the inorganic structure 40. Therefore, a surface (e.g., an entire surface) exposed by the first adhesion increasing recess 50a comprises an inorganic material, and is included in the inorganic surface portion 30. More specifically, because the lateral surface of the first adhesion increasing recess 50a comprises the same material as that of the inorganic structure 40, both the lateral surface and the inorganic structure 40 comprise only one or more inorganic materials. Because a bottom surface of the first adhesion increasing recess 50a corresponds to the top surface of the partially exposed second lower inorganic film 113, both the bottom surface and the top surface comprise an inorganic material. Accordingly, the area of the inorganic surface portion 30 contacting the first inorganic film 211 of the flexible encapsulation multilayer 210 increases, thereby further improving encapsulating reliability.

In one or more example embodiments, a plurality of the first adhesion increasing recesses 50a may be formed in the inorganic structure 40, and may be disposed at uniform or substantially uniform intervals. Here, the phrase "substantially uniform intervals" refers to that the first adhesion increasing recesses 50a are disposed at approximately uniform intervals, not that the first adhesion increasing recesses 50a are disposed at completely equal intervals. Also, In one or more example embodiments, the first adhesion increasing recess 50a may not be present in parts (or portions) of the peripheral area PA.

Referring to FIG. 10, a second adhesion increasing recess 50b may be formed in the peripheral area PA. In one or more example embodiments, the second adhesion increasing recess 50b may be formed by removing a part (or portion) of the second lower inorganic film 113. Therefore, a surface (e.g., an entire surface) exposed by the second adhesion increasing recess 50b comprises an inorganic material, and is included in the inorganic surface portion 30. More specifically, because the lateral surface of the second adhesion increasing recess 50b comprises the same material as the second lower inorganic film 113, both the lateral surface and the second lower inorganic film 113 comprise only one or more inorganic materials. Because a bottom surface of the second adhesion increasing recess 50b corresponds to a top surface of the partially exposed first lower inorganic film 111, both the bottom surface and the top surface comprise only one or more inorganic materials. Accordingly, the area of the inorganic surface portion 30 contacting the first inorganic film 211 of the flexible encapsulation multilayer 210 increases, thereby further improving encapsulating reliability.

In one or more example embodiments, a plurality of the second adhesion increasing recesses 50b may be formed, and may be disposed at uniform or substantially uniform intervals. Here, the term "substantially uniform intervals" refers to that the second adhesion increasing recesses 50b are disposed at approximately uniform intervals, not that the second adhesion increasing recesses 50b are disposed at completely equal intervals. Also, In one or more example embodiments, the second adhesion increasing recess 50b may not be present in parts (or portions) of the peripheral area PA.

Figure 11:
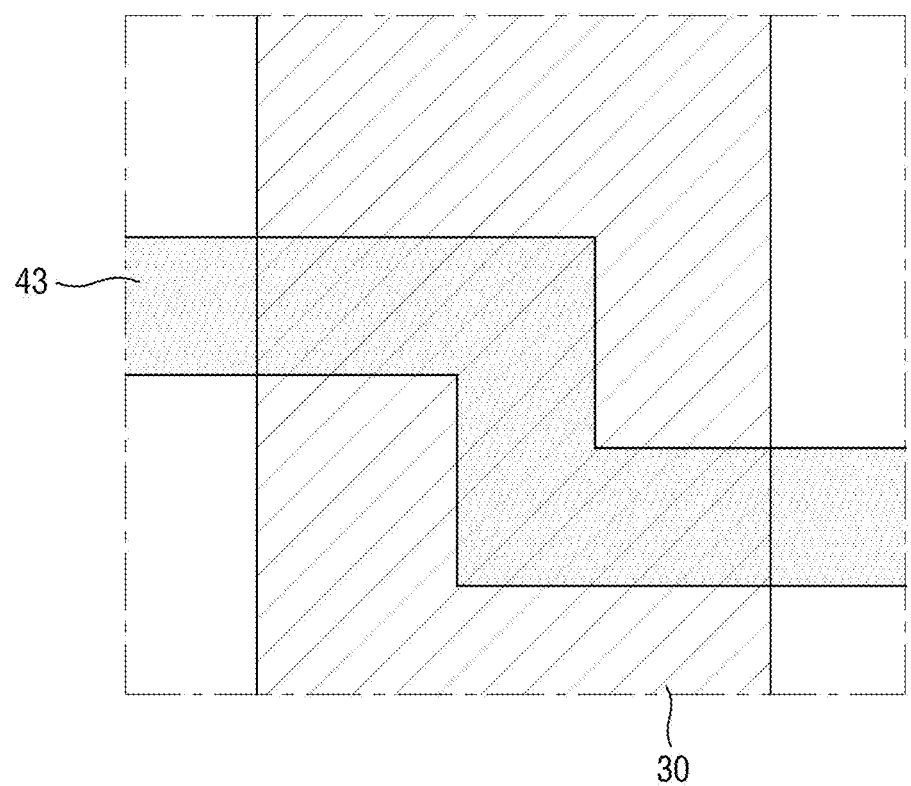
FIG. 11 is a view showing a modified example of FIG. 5.
Figure 11:
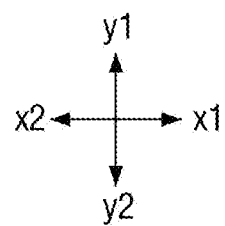
Figure 12:
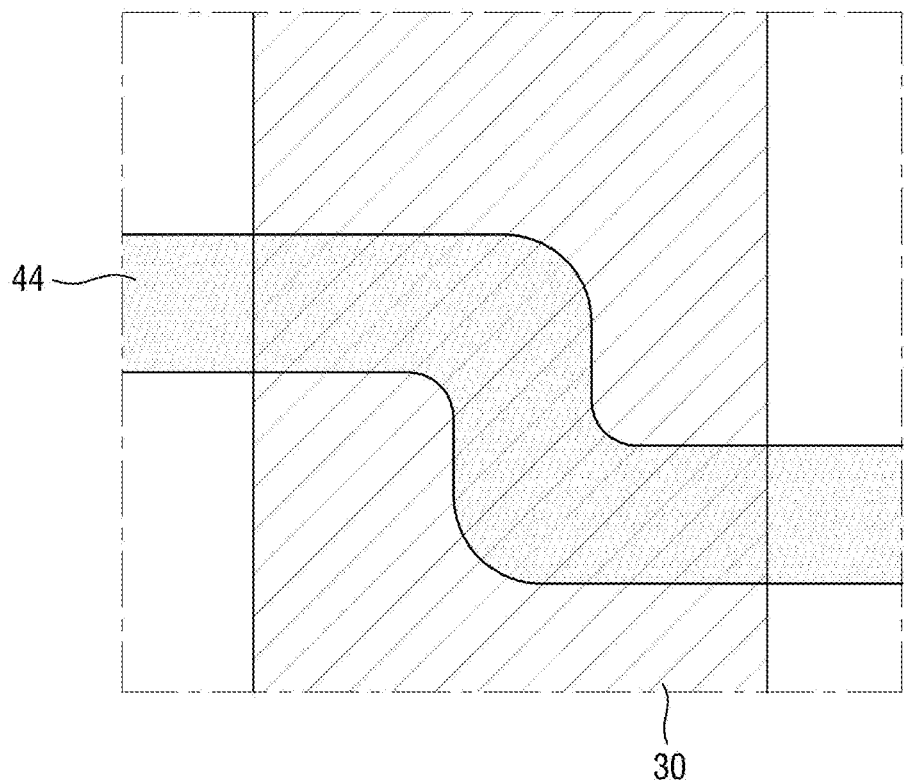
FIG. 12 is a view showing another modified example of FIG. 5.
Figure 12:
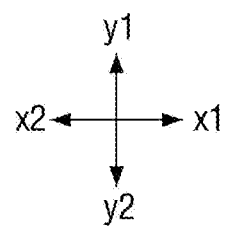

FIG. 11 is a view showing a modified example of FIG. 5, and FIG. 12 is a view showing another modified example of FIG. 5.

Referring to FIG. 11, an edge of an inorganic structure 43, unlike that shown in FIG. 5, may include angled portions. For example, the edge of the inorganic structure 43, as shown in FIG. 11, may include a first portion extending along the first direction x1, a second portion extending from the first portion along the opposite direction y2 of the second direction y1, and a third portion extending from the second portion along the first direction x1. Here, the first portion and the second portion may form an angle (e.g., a predetermined angle) therebetween, and similarly, the second portion and the third portion may form an angle (e.g., a predetermined angle) therebetween. Even when the inorganic structure 43 is provided with the angled portions in this way, as shown in FIG. 11, an effect similar to that described above with reference to FIG. 6 occurs.

Referring to FIG. 12, an edge of an inorganic structure 44, unlike that shown in FIG. 11, may include rounded portions. For example, the edge of the inorganic structure 44, as shown in FIG. 12, may include a first portion extending along the first direction x1, a second portion from the first portion along the opposite direction y2 of the second direction y1, a third portion extending from the second portion along the first direction x1, a first connection portion, which is rounded, between the first portion and the second portion, and a second connection portion, which is rounded, between the second portion and the third portion. Even when the inorganic structure 44 is provided with the rounded portions as shown in FIG. 12, an effect similar to that described above with reference to FIG. 6 occurs.

Figure 13:
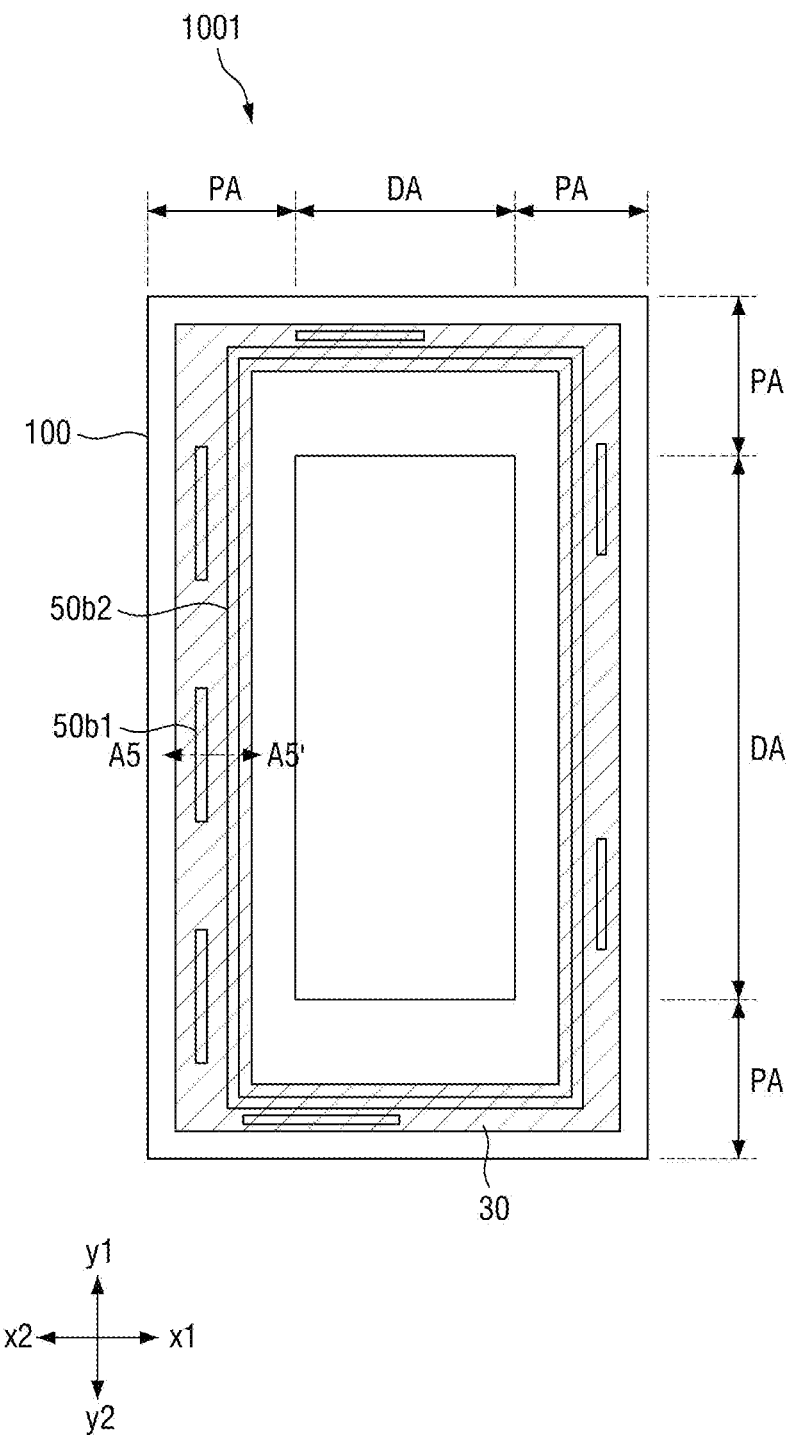
FIG. 13 is a schematic plan view showing a display device according to another example embodiment of the present invention.
Figure 14:
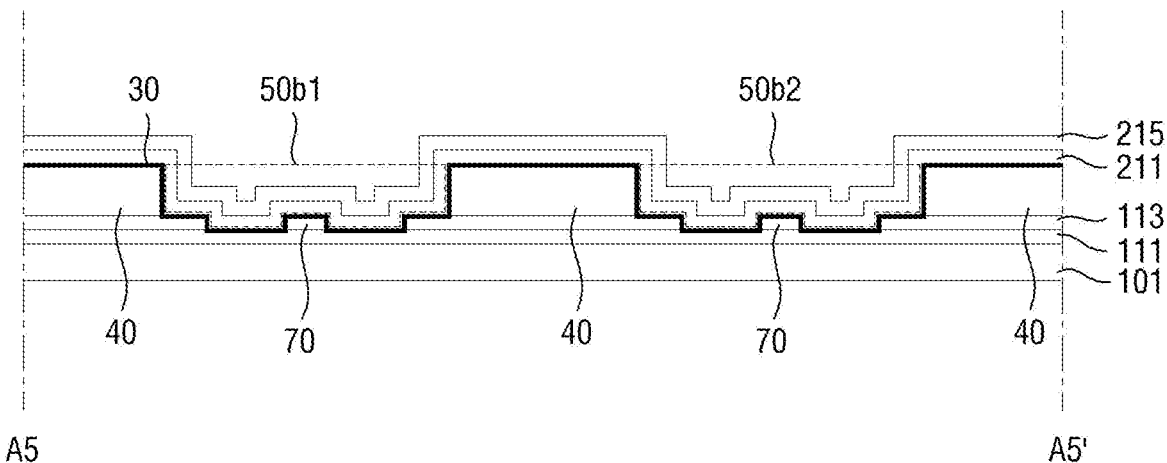
FIG. 14 is a sectional view taken along the line A5-A5' of FIG. 13.
Figure 15:
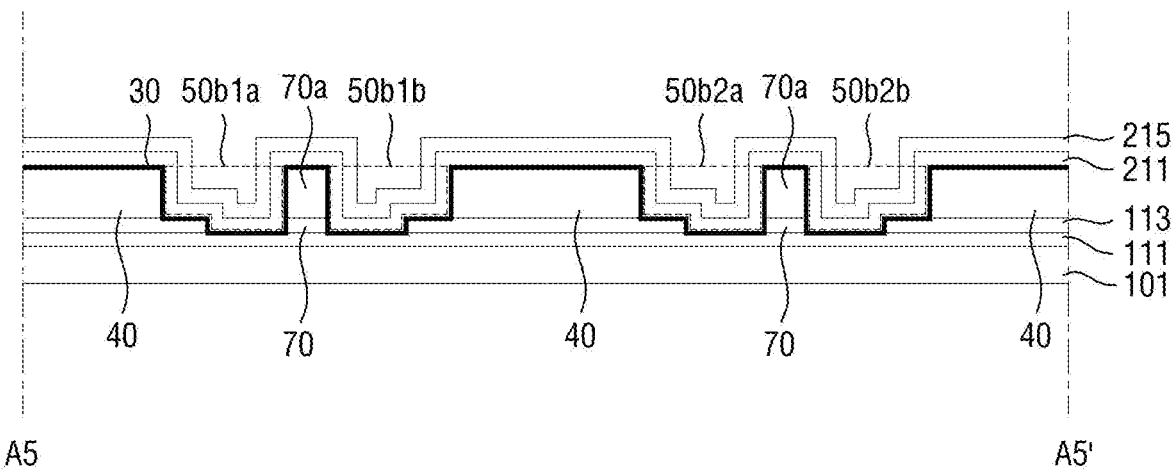
FIG. 15 is a sectional view showing a modified example of FIG. 14.

FIG. 13 is a schematic plan view showing a display device according to another example embodiment of the present invention, FIG. 14 is a sectional view taken along the line A5-A5' of FIG. 13, and FIG. 15 is a sectional view showing a modified example of FIG. 14.

Referring to FIGS. 13 and 14, a display device 1001 includes a first adhesion increasing recess 50b1 and a second adhesion increasing recess 50b2 in the peripheral area PA. The first adhesion increasing recess 50b1 may have a shape extending along an edge of the inorganic surface portion 30. This first adhesion increasing recess 50b1 may be formed in a plurality.

The second adhesion increasing recess 50b2 may be located closer to (e.g., adjacent to) the display area DA, compared to the first adhesion increasing recess 50b1, and may have a shape that continuously surrounds the display area DA. Although not shown in the drawings, the second adhesion increasing recess 50b2 may be formed in a plurality. Although both the first adhesion increasing recess 50b1 and the second adhesion increasing recess 50b2 are shown as being formed in the peripheral area PA of the display device 1001, this is only one example. That is, In one or more example embodiments, any one of the first adhesion increasing recess 50b1 and the second adhesion increasing recess 50b2 may be omitted.

The extending direction of the first adhesion increasing recess 50b1 is perpendicular or substantially perpendicular to a direction of infiltration of moisture and/or oxygen from the outside of the display device 1001 towards a center of the display device 1001. Similarly, when the second adhesion increasing recess 50b2 has the shape that continuously surrounds the display area DA, the extending direction of the second adhesion increasing recess 50b2 is perpendicular or substantially perpendicular to the direction of infiltration of moisture and/or oxygen from the outside of the display device 1001 towards the center of the display device 1001. Therefore, moisture and/or oxygen may not infiltrate into the display device 1001.

Referring to FIG. 14, each of the first adhesion increasing recess 50b1 and the second adhesion increasing recess 50b2 may be formed by removing a part (or portion) of the inorganic structure 40, and a part (or portion) of the second lower inorganic film 113. Accordingly, the area of the inorganic surface portion 30 may be effectively increased and, thus, the contact area between the inorganic surface portion 30 and the lower surface of the flexible encapsulation multilayer 210 and/or the contact area between the inorganic surface portion 30 and the lower surface of the first inorganic film 211 may be increased.

In one or more example embodiments, a stepped surface may be formed on the bottom surfaces of the first adhesion increasing recess 50b1 and the second adhesion increasing recess 50b2. The stepped surface may be a surface of a protrusion 70. The protrusion 70 may be a part (or portion) of the second lower inorganic film 113 and, thus, the area of the inorganic surface portion 30 may be further increased.

The height of the protrusion 70 that is measured based on the upper surface of the first lower inorganic film 111 is relatively smaller than the depth of the first adhesion increasing recess 50b1. Although not shown in the drawings, a planar shape of the protrusion 70 may be variously formed, such as a cross shape, a stripe shape, and/or the like. However, the protrusion 70 having a portion extending in the same or substantially the same direction as that of the edge of the inorganic surface portion 30, regardless of whether it has a cross shape or a straight shape, may be more effective at preventing or reducing infiltration of moisture and/or oxygen, because it allows at least the portion of the protrusion 70 to be perpendicular or substantially perpendicular to the direction of infiltration of moisture and/or oxygen from the lateral side of the display device towards the center of the display device.

In one or more example embodiments, a protrusion 70a, as shown in FIG. 15, may be further disposed on the protrusion 70. The protrusion 70a may be a part (or portion) of the inorganic structure 40.

The height of the protrusion 70a that is measured based on the upper surface of the first lower inorganic film 111 may be equal or substantially equal to the height of the inorganic structure 40 that is measured based on the upper surface of the first lower inorganic film 111. In this case, the first adhesion increasing recess 50b1, described with reference to FIG. 14, may be divided into first sub-adhesion increasing recesses 50b1a and 50b1b, and the second adhesion increasing recess 50b2, described with reference to FIG. 14, may be divided into second sub-adhesion increasing recesses 50b2a and 50b2b. Detailed description of the shape of the protrusion 70a and detailed description of the effect due to the protrusion 70a will be omitted because they are the same or similar to those of the protrusion 70 described above with reference to FIGS. 13 and 14.

Figure 16:
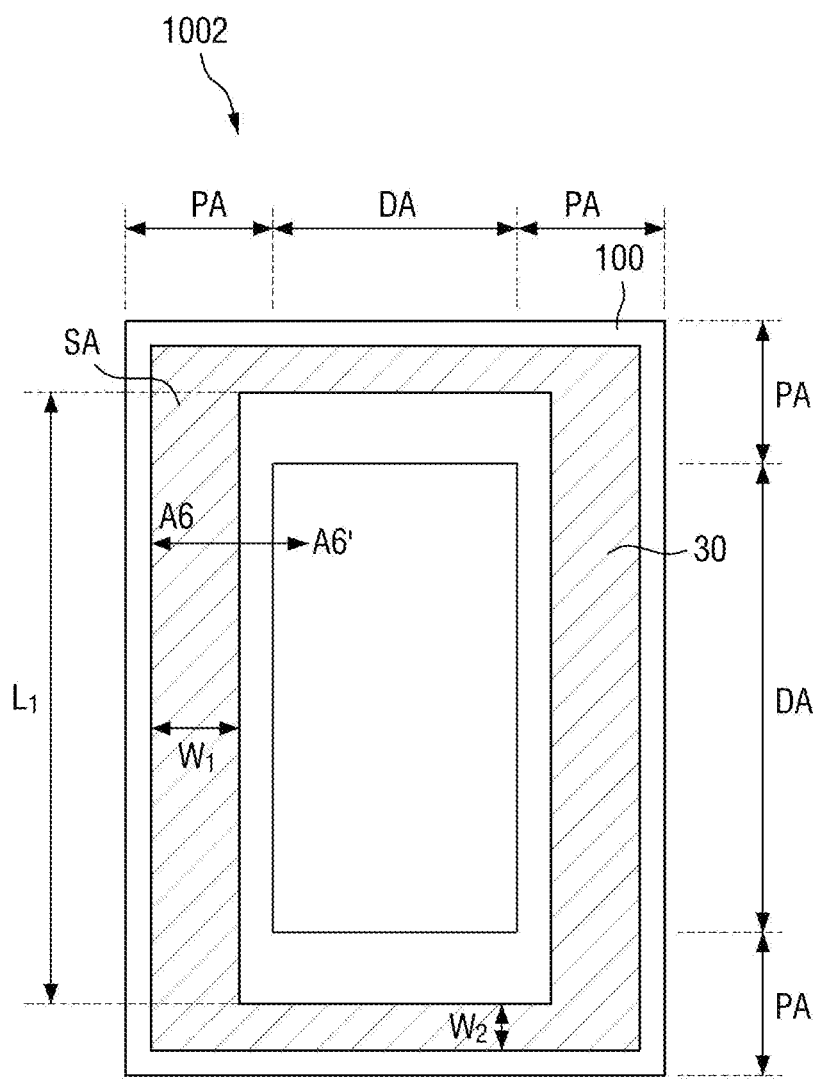
FIG. 16 is a schematic plan view showing a display device according to still another example embodiment of the present invention.
Figure 17:
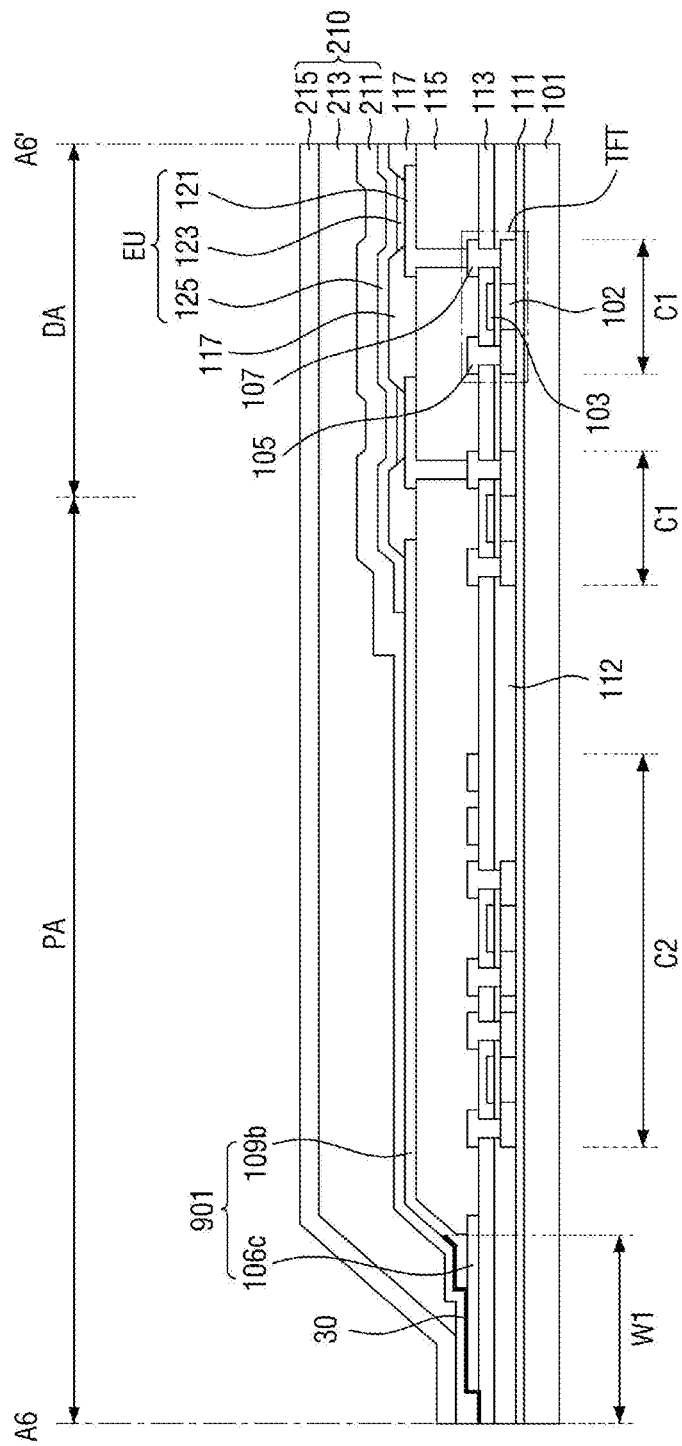
FIG. 17 is a sectional view taken along the line A6-A6' of FIG. 16.
Figure 18:
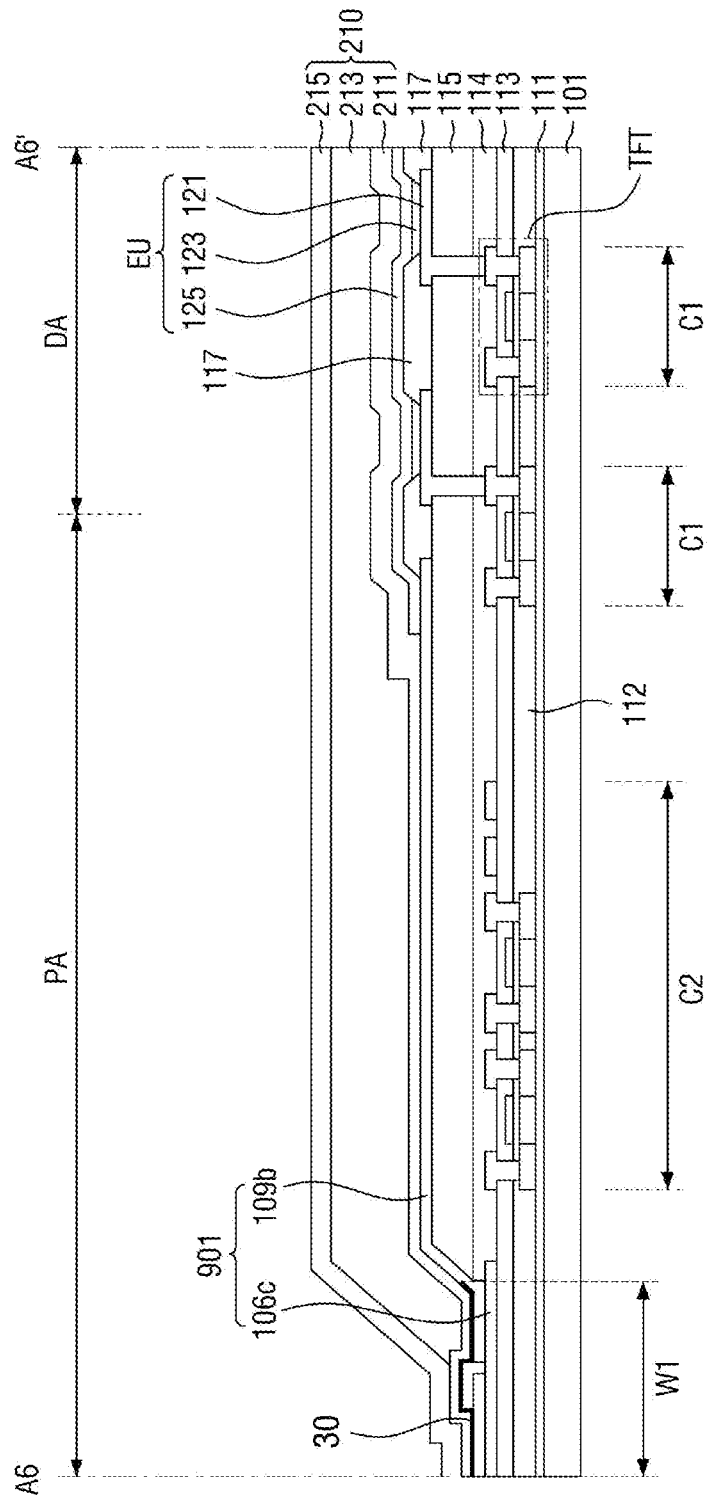
FIG. 18 is a sectional view showing a modified example of FIG. 17.

FIG. 16 is a schematic plan view showing a display device according to still another example embodiment of the present invention, FIG. 17 is a sectional view taken along the line A6-A6' of FIG. 16, and FIG. 18 is a sectional view showing a modified example of FIG. 17.

Referring to FIGS. 16 to 18, when viewed from a planar view, in a display device 1002, the width of a long side or a portion extending along the y1-y2 directions (hereinafter, referred to as "a first extending portion") of the display device 1002 in the inorganic surface portion 30 and the width of a short side or a portion extending along the x1-x2 directions (hereinafter, referred to as "a second extending portion") of the display device 1002 in the inorganic surface portion 30 are different from each other. In more detail, a first width W1 measured in the x1-x2 directions at the first extending portion in the inorganic surface portion 30 is relatively greater than a second width W2 measured in the y1-y2 directions at the second extending portion in the inorganic surface portion 30.

When the display device 1002 is embodied as a flexible display device having flexibility, the display device 1002 may be bent and unbent (e.g., spread) many times. In this case, the stress applied to the long side of the display device 1002 may be relatively greater than the stress applied to the short side of the display device 1002. Therefore, the void Vo between the flexible encapsulation multilayer 210 and the lower structure 100 may occur at the long side of the display device 1002. Accordingly, the encapsulating properties may be improved by having the first width W1 of the first extending portion of the inorganic surface portion 30 to be relatively greater than the second width W2 of the second extending portion of the inorganic surface portion 30.

Because the side of the inorganic surface portion 30 may have a plurality of bent portions, it may be desirable for the first width W1 to be calculated as an average width. That is, the value obtained by dividing the area SA of the first extending portion of the inorganic surface portion 30 by the length L1 measured in the y1-y2 directions at the first extending portion may determine the first width W1 of the first extending portion. Here, the area SA of the first extending portion refers to an area viewed from a planar view.

The lower structure 100 of the display device 1002 includes a lower encapsulation inorganic film which horizontally extends under the surface portion of the lower structure 100 to vertically correspond to the display area DA and the peripheral area PA. Because a structure comprising an organic material is not interposed in the portion between the inorganic surface portion 30 of the display device 1002 and the lower encapsulation inorganic film, the portion between the inorganic surface portion 30 of the display device 1002 and the lower encapsulation inorganic film comprises only one or more inorganic materials. Here, the lower encapsulation inorganic film may be any one selected from the inorganic films 111, 113 and 115. Here, at least one inorganic material may include SiN and/or SiON for improving encapsulating properties.

Hereinafter, a configuration of the display device 1002 will be described in more detail, and repeat description with that described above will be simplified or omitted.

The display device 1002 includes a substrate 101, a thin film transistor TFT formed the substrate 101, an electroluminescent unit EU connected to the thin film transistor TFT, and a flexible encapsulation multilayer 210 for encapsulating the electroluminescent unit EU.

As described above, the display device 1002 is divided into a display area DA and a peripheral area PA surrounding (e.g., located around) the display area DA. The display area DA is disposed at (or near) the center of the substrate 101, and is an area where an image is displayed. The peripheral area PA is disposed at an edge of the substrate 101 to surround the display area DA, and is an area where no image is displayed.

The substrate 101 may support the display device (e.g., the entire display device) 1002 and may maintain or substantially maintain rigidity. The substrate 101 may comprise a transparent insulating material, and may have flexibility.

A plurality of electroluminescent units EU, which emit light for displaying an image, are disposed for each pixel on a portion of the substrate 101 corresponding to the display area DA. An upper electrode power supply wire 901 for applying an electric signal or power to an upper electrode 125 of the electroluminescent unit EU disposed in the display area DA is disposed in the peripheral area PA. The upper electrode power supply wire 901 includes a bus wire 109b and an auxiliary upper electrode 106c. Hereinafter, components disposed in the display area DA and the peripheral area PA will be described in order of lamination from the substrate 101.

A buffer film 111 is formed on the substrate 101. The buffer film 111 smooths the upper surface of the substrate 101, and blocks or reduces the infiltration of impurities. The buffer film 111 may be a multilayer or a single layer and may comprise an inorganic material, such as silicon oxide ($SiO_x$), silicon oxynitride and/or silicon nitride ($SiN_x$). The buffer film 111 may be formed by various deposition methods. The buffer film 111 may be omitted, if desired.

A pixel circuit C1 is formed on the buffer film 111. The pixel circuit C1 includes at least one thin film transistor TFT. The thin film transistor TFT is electrically connected to the electroluminescent unit EU to drive the electroluminescent unit EU. Although not shown in the drawings, the pixel circuit C1 may further include at least one capacitor.

The thin film transistor TFT may be a top gate type thin film transistor, which sequentially includes an active layer 102, a gate electrode 103, a source electrode 105, and a drain electrode 107. However, this is only one example, and the thin film transistor TFT may be formed as various suitable types, such as a bottom gate type. Hereinafter, a case where the thin film transistor TFT is a top gate type thin film transistor will be described in more detail, as an example.

The active layer 102 is formed on the buffer film 111. The active layer 102 may contain a semiconductor material, for example, amorphous silicon or poly crystalline silicon. However, the present invention is not limited thereto, and the active layer 102 may contain an oxide semiconductor material, for example, $G\text{-}I\text{-}Z\text{-}O[(In_2O_3)_a(Ga_2O_3)_b(ZnO)_c]$ (where a, b, and c are real numbers satisfying the conditions of a≥0, b≥0, and c>0, respectively). The active layer 102 may contain an oxide from among any one selected from 12, 13, and 14 group metal elements. Examples of the oxide may comprise zinc (Zn), indium (In), gallium (Ga), tin (Sn), cadmium (Cd), germanium (Ge), hafnium (Hf), or a combination thereof. The active layer 102 includes a source region in contact with the source electrode 105, a drain region in contact with the drain electrode 107, and a channel region located between the source region and the drain region. When the active layer 102 contains amorphous silicon or polycrystalline silicon, the source region and the drain region may be doped with impurities, if desired.

A gate insulating film 112 is formed on the active layer 102, and may be a multilayer or a single layer and may comprise an inorganic material, such as silicon oxide ($SiO_x$), silicon oxynitride and/or silicon nitride ($SiN_x$). The gate insulating film 112 may insulate the active layer 102 from the gate electrode 103.

The gate electrode 103 is formed on the gate insulating film 112. The gate electrode 103 is connected to a gate line for applying an on/off signal to the thin film transistor TFT. The gate electrode 103 may comprise a low-resistance metal material. The gate electrode 103 may be a multilayer or a single layer and may comprise a conductive material including molybdenum (Mo), aluminum (Al), copper (Cu), and/or titanium (Ti).

An interlayer insulating film 113 is formed on the gate electrode 103. The interlayer insulating film 113 may insulate the source electrode 105 and the drain electrode 107 from the gate electrode 103. The interlayer insulating film 113 may be a multilayer or a single layer and may comprise an inorganic material, such as metal oxides and metal nitrides. For example, the inorganic material may include silicon nitride (SiN), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZrO_2$), or a combination thereof.

The source electrode 105 and the drain electrode 107 are formed on the interlayer insulating film 113. The source electrode 105 and the drain electrode 107 are in contact with the source region and drain region, respectively, of the active layer 102 through contact holes formed in the interlayer insulating film 113 and the gate insulating film 112. A planarization film 115 is formed on the thin film transistor TFT formed in this way. The planarization film 115 may be a single layer or a multilayer and may comprise an organic material, such as general purpose polymers. Examples of the organic material may comprise polymethylmethacrylate (PMMA), polystyrene (PS), and/or polymer derivatives having a phenolic group, acrylic polymers, imide polymers, aryl ether polymers, amide polymers fluorine polymers, p-xylene polymers, and/or vinyl alcohol polymers. The planarization film 115 may eliminate or reduce steps on the top surface caused by a thin film transistor (TFT) array and may make the top surface thereof flat, thereby preventing or reducing the occurrence of defects in the electroluminescent unit EU due to unevenness of a layer below the electroluminescent unit EU.

The electroluminescent unit EU is formed at a portion of an upper surface of the planarization film 115, the portion corresponding to the display area DA. The electroluminescent unit EU includes a lower electrode 121, an upper electrode 125 facing the lower electrode 121, and an electroluminescent layer 123 disposed between the lower electrode 121 and the upper electrode 125. The lower electrode 121 may be disposed on the planarization film 115 and may penetrate the planarization film 115 to be connected to the drain electrode 107.

The electroluminescent layer 123 may contain an organic material. The display device may be classified as a bottom emission type, a top emission type, or a dual emission type according to an emission direction of the electroluminescent unit EU. In the bottom emission type display device, the lower electrode 121 is provided as a transparent or semitransparent electrode, and the upper electrode 125 is provided as a reflective electrode. In the top emission type display device, the lower electrode 121 is provided as a reflective electrode, and the upper electrode 125 is provided as a transparent or semitransparent electrode. In the dual emission type display device, both the lower electrode 121 and the upper electrode 125 may be provided as transparent or semitransparent electrodes.

When the lower electrode 121 functions as an anode, the lower electrode 121 may contain a conductive material having a high work function. Examples of the conductive material may comprise indium tin oxide (ITO), indium zinc oxide (IZO), zinc oxide (ZnO), indium oxide ($In_2O_3$), indium gallium oxide (IGO), aluminum zinc oxide (AZO), or a combination thereof. The lower electrode 121 may be patterned in an island shape corresponding to each pixel. Further, the lower electrode 121 may be connected to the drain electrode 107 of the thin film transistor TFT to receive an electric current.

A pixel defining layer (PDL) 117 for covering a portion (e.g., an edge portion) of the lower electrode 121 may be formed on the lower electrode 121. The pixel defining layer 117 may comprise one or more organic insulating materials. Examples of the one or more organic insulating materials may comprise polyimide, polyamide, acrylic resin, benzocyclobutene, phenol resin or a combination thereof. The pixel defining layer 117 may be formed by a spin coating method or the like. An opening (e.g., a predetermined opening) for defining a pixel is formed in the pixel defining layer 117. The electroluminescent layer 123 is formed at least in a region defined by the opening. In some example embodiments of the present invention, the pixel defining layer 117 is used to form a light-emitting layer by a solution technique, such as ink jet printing, nozzle printing, and the like, and may function as a barrier having a relatively high height.

The electroluminescent layer 123 may contain a low-molecular organic material and/or a high-molecular organic material, which may emit red, green, or blue light. Although not shown in the drawings, a hole transport layer (HTL) and/or a hole injection layer (HIL) may be disposed between the electroluminescent layer 123 and the lower electrode 121. Further, although not shown in the drawings, an electron transport layer (ETL) and/or an electron injection layer (EIL) may be disposed between the electroluminescent layer 123 and the upper electrode 125. Of course, various layers other than the hole injecting layer, the hole transporting layer, the electron transporting layer, and the electron injecting layer may be laminated as needed.

Meanwhile, in the above description, a case where the electroluminescent layer 123 is formed separately for each pixel has been described as an example. In this case, red, green, and/or blue light may be respectively emitted for each pixel, and a pixel group for emitting red, green, and blue light may form one unit pixel. However, the present invention is not limited thereto, and an organic light-emitting layer may be formed in common over the entire pixel. For example, a plurality of organic light emitting layers for emitting red, green, and blue light may be vertically laminated or mixed to emit white light. However, the color combination for emitting white light is not limited thereto. In this case, a color conversion layer or color filter for converting the emitted white light into a color (e.g., a predetermined color) may be provided.

The upper electrode 125 may comprise a conductive inorganic material. When the upper electrode 125 functions as a cathode, for example, it may comprise Al, Mg, Ag, or the like, which has a low work function. The upper electrode 125 may be formed as a common electrode over the display area (e.g., the entire display area DA), in which an image is displayed. In this case, the upper electrode 125 may be formed by an evaporation process that does not damage the electroluminescent layer 123. Meanwhile, the polarities of the lower electrode 121 and the upper electrode 125 may be opposite to each other.

The upper electrode 125 is connected to an upper electrode power supply wire 901 that is disposed in the peripheral area PA to receive an electric signal or power. The upper electrode power supply wire 901 includes a bus wire 109$b$ and an auxiliary upper electrode 106$c$.

The bus wire 109$b$ applies an externally supplied electric signal or power to the upper electrode 125. Therefore, the bus wire 109$b$ comprises a conductive inorganic material that may sufficiently conduct an electric current. For example, the bus wire 109b may be a single layer or a multilayer and may comprise one or more metals. Examples of the one or more metals may comprise aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a combination thereof. The bus wire 109b is formed on the interlayer insulating film 113. The bus wire 109b may be formed concurrently (e.g., at the same time) when the source electrode 105 and the drain electrode 107 of the pixel thin film transistor TFT are formed. In this case, the bus wire 109b may comprise the same conductive inorganic material as the source electrode 105 and the drain electrode 107.

The bus wire 109b should be electrically connected to the upper electrode 125. However, the bus wire 109b and the upper electrode 125 are spaced from each other because they are formed on different layers from each other. Therefore, the auxiliary upper electrode 106c for electrically connecting the bus wire 109b and the upper electrode 125 is further included.

The auxiliary upper electrode 106c is in contact with each of the bus wire 109b and the upper electrode 125 to transmit an electric signal or power supplied from the bus wire 109b to the upper electrode 125. The auxiliary upper electrode 106c serves as a bridge or a link. Therefore, the auxiliary upper electrode 106c comprises a conductive inorganic material that may conduct a sufficient electric current. For example, the auxiliary upper electrode 106c may be a single layer or a multilayer and may comprise one or more metals. Examples of the one or more metals may comprise aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a combination thereof. Meanwhile, a lateral surface portion of the planarization film 115 is disposed in the peripheral area PA, and the auxiliary upper electrode 106c is disposed along the lateral surface and upper surface of the planarization film 115. According to an example embodiment of the present invention, the auxiliary upper electrode 106c may be formed of the same or substantially the same material as the lower electrode 121, and may be formed concurrently (e.g., together) with the lower electrode 121.

The auxiliary upper electrode 106c may have a shape extending along the periphery of the display area DA in the peripheral area PA. In more detail, the auxiliary upper electrode 106c has a shape surrounding or substantially surrounding the display area DA in the peripheral area PA, when viewed from a planar view, thereby preventing or reducing the IR drop of the upper electrode 125. In relation to the shape of the auxiliary upper electrode 106c, the terms "shape surrounding the display area DA" or "shape substantially surrounding the display area DA" includes a shape that partially surrounds the display area DA as well as a shape that entirely surrounds the display area DA, so long as there is an IR drop prevention or reduction effect. In order to increase the area of a contact region between the auxiliary upper electrode 106c and the bus wire 109b, the bus wire 109b may have a shape extending along the periphery of the display area DA in the peripheral area PA. In more detail, the bus wire 109b may also have a shape surrounding or substantially surrounding the display area DA in the peripheral area PA.

The flexible encapsulation multilayer 210 is formed on the substrate (e.g., the entire substrate) 101 to cover both the display area DA and the peripheral area PA. Alternatively, the flexible encapsulation multilayer 210 may be formed on the substrate 101 to cover the display area (e.g., the entire display area) DA and at least a part (or portion) of the peripheral area PA. The flexible encapsulation multilayer 210 protects the electroluminescent unit EU from external moisture, oxygen, and/or the like. The flexible encapsulation multilayer 210 may include a first inorganic film 211, an organic film 213 disposed on the first inorganic film 211, and a second inorganic film 215 disposed on the organic film 213. Here, the organic film 213 allows the surface of the second inorganic film 215 to have a flat or substantially flat area FA.

In addition, the flexible encapsulation multilayer 210 may have various structures. Illustratively, the flexible encapsulation multilayer 210 may sequentially include a first inorganic layer, a first organic layer, a second inorganic layer, a second organic layer, and a third inorganic layer, from a top of the electroluminescent unit EU. Alternatively, the flexible encapsulation multilayer 210 may sequentially include a first inorganic layer, a first organic layer, a second inorganic layer, a second organic layer, a third inorganic layer, a third organic layer, and a fourth inorganic layer, from the top of the organic light emitting element. Here, the first organic layer may have a relatively smaller area than the second inorganic layer, and the second organic layer may have a relatively smaller area than the third inorganic layer. Further, the first organic layer may be completely covered by the second inorganic layer, and the second organic layer may be completely covered by the third inorganic layer. Further, because the area of the third inorganic layer is relatively larger than the areas of the first inorganic layer, the first organic layer, the second inorganic layer, and the second organic layer, the third inorganic layer may cover the edges of the first inorganic layer, the first organic layer, the second inorganic layer, and the second organic layer. As described above, the flexible encapsulation multilayer 210 may have various structures, but the lower surface of the flexible encapsulation multilayer 210 may comprise only one or more inorganic materials.

The flexible encapsulation multilayer 210 may protect the electroluminescent unit EU included in the display area DA from external moisture and/or oxygen even when the flexible encapsulation multilayer 210 alone encapsulates the lower structure 100. That is, a display device that is reliable against the infiltration of external moisture and/or oxygen may be realized by allowing the flexible encapsulation multilayer 210 alone to encapsulate the electroluminescent unit EU without using another additional encapsulating member that may prevent or reduce the infiltration of moisture and/or oxygen. The flexible encapsulation multilayer 210 may include a plurality of films. However, the present invention is not limited thereto, and the term "flexible encapsulation multilayer 210" may also refer to a single layer having excellent encapsulating ability, and is included in the scope of the present invention.

The peripheral area PA has an inorganic surface portion 30 of a closed shape surrounding (e.g., continuously surrounding) the display area DA. The inorganic surface portion 30 is in direct contact with the lower surface of the flexible encapsulation multilayer 210. Because the inorganic surface portion 30 contains only one or more inorganic materials and the lower surface of the flexible encapsulation multilayer 210 contains only one or more inorganic materials, the direct bonding of the inorganic surface portion 30 and the lower surface of the flexible encapsulation multilayer 210 forms an inorganic-inorganic direct bonding.

The lower structure 100 has a lower encapsulation inorganic film extending to vertically correspond to the display area DA and the peripheral area PA under the surface portion of the lower structure 100, and a portion of the lower structure 100 disposed between the inorganic surface portion 30 and the lower encapsulation inorganic film may contain only one or more inorganic materials. The lower encapsulation inorganic film may include, for example, a buffer film 111, a gate insulating film 112, and/or an interlayer insulating film 113. Here, the lower encapsulation inorganic film may contain silicon nitride or/or silicon oxynitride having a relatively low moisture and/or oxygen permeability. The lower encapsulation inorganic film may contain at least one hole that is filled with an inorganic material that is different from the inorganic material contained in the lower encapsulation inorganic film.

The upper portion of the display device is encapsulated by the flexible encapsulation multilayer 210, the lower portion of the display device is encapsulated by the lower encapsulation inorganic film, such as the buffer film 111, the gate insulating film 112, and/or the interlayer insulating film 113, and the lateral portion of the display device is encapsulated by the portion containing only one or more inorganic materials and disposed between the inorganic surface portion 30 and the lower encapsulation inorganic film such the buffer film 111, the gate insulating film 112, and/or the interlayer insulating film, thereby achieving a complete encapsulating structure.

As described above, the planarization film 115 may comprise an organic material. An inorganic film formed by a deposition process, such as chemical vapor deposition (CVD), physical vapor deposition (PVD), and the like, is difficult to realize a planarized upper surface as compared to an organic film formed by a solution process, such as spin coating, ink jet coating, and the like. Therefore, when forming the planarization film 115 by using an inorganic film, there is a problem that the height of the planarization film 115 should be increased by laminating a relatively large number of inorganic layers or should be increased even by a single inorganic film. Thus, it is preferred that the planarization film 115 comprises an organic material. Accordingly, an organic material is interposed between the inorganic surface of the auxiliary upper electrode 106c and the lower encapsulation inorganic film, such as the buffer film 111, the gate insulating film 112 and the interlayer insulating film 113. Therefore, the inorganic surface portion 30 may not be formed in the region where the planarization film 115 is formed. As a result, according to example embodiments of the present invention, the inorganic surface portion 30 is located relatively lower than the upper surface of the planarization film 115. Here, the term "located relatively lower" includes the term "located relatively closer" to the substrate 101.

FIG. 18 is a sectional view showing a modified example of FIG. 17. The structure of FIG. 18 is substantially different from the structure of FIG. 17 in that the structure of FIG. 18 further includes an inorganic film 114. However, other features shown in FIG. 18 is the same or substantially the same as those of FIG. 17, and therefore, repeated description may be omitted.

The bus wire 109b overlaps with the inorganic surface portion 30. In this specification, the meaning of "overlap" includes not only a case where the bus wire 109b is included in the inorganic surface portion 30 to be in contact with the bottom surface of the flexible encapsulation multilayer 210 as shown in FIG. 17, but also includes a case where the bus wire 109b vertically corresponds to the inorganic surface portion 30 without being in contact with the bottom surface of the flexible encapsulation multilayer 210 as shown in FIG. 18. That is, the term "overlap" includes a case where the bus wire 109b is located beneath the inorganic surface portion 30.

Figure 19:
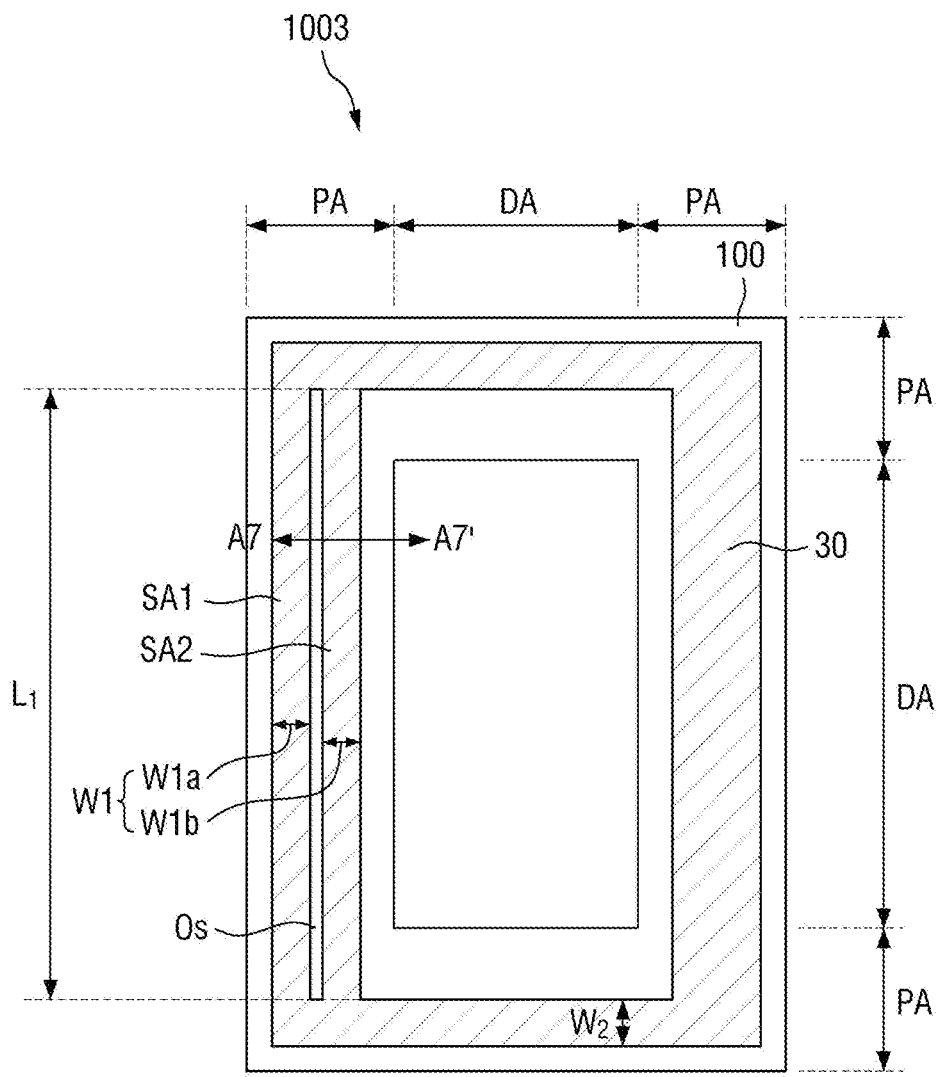
FIG. 19 is a schematic plan view showing a display device according to still another example embodiment of the present invention.
Figure 20:
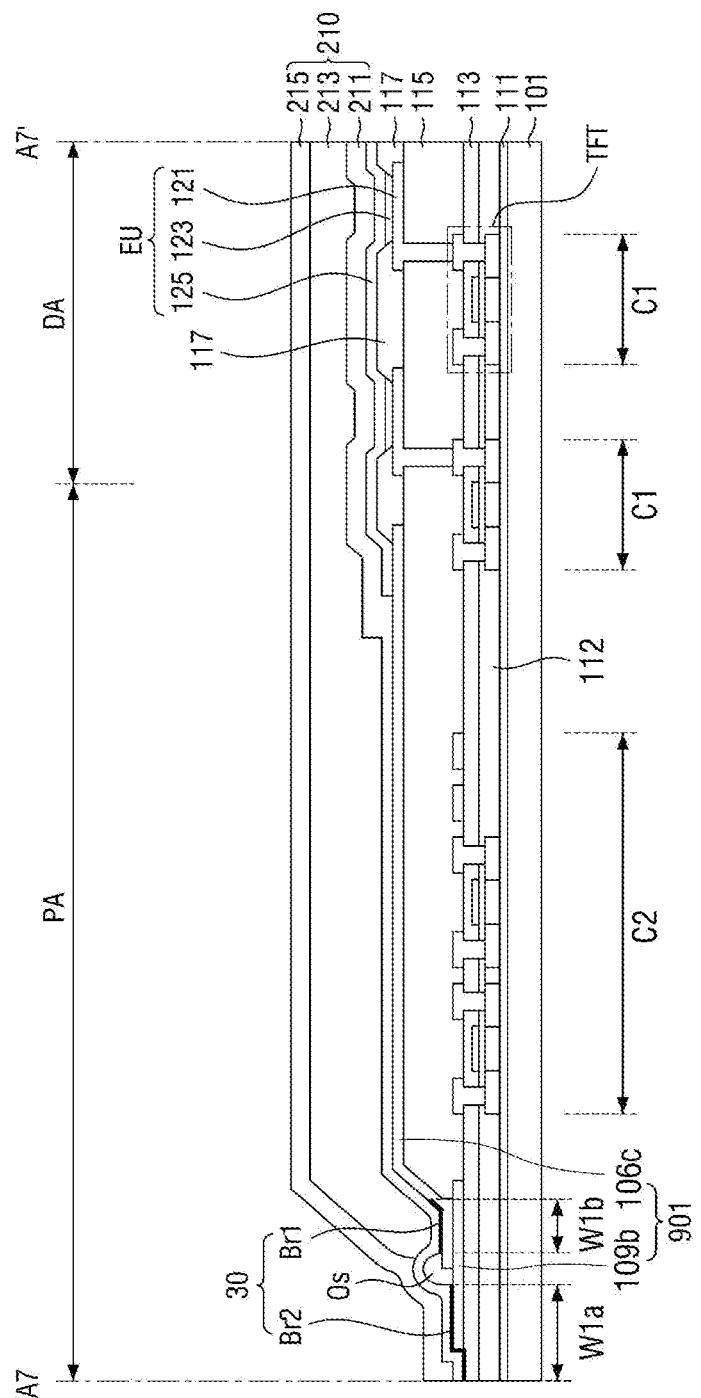
FIG. 20 is a sectional view taken along the line A7-A7' of FIG. 19.

FIG. 19 is a schematic plan view showing a display device according to still another example embodiment of the present invention, and FIG. 20 is a sectional view taken along the line A7-A7' of FIG. 19. Referring to FIGS. 19 and 20, a display device 1003 according to this example embodiment is the same or substantially the same as the above-described display device (e.g., 1002 shown in FIGS. 16 and 17), except for an organic surface portion Os.

Referring to FIG. 19, the inorganic surface portion 30 is divided into a first inorganic surface branch SA1 and a second inorganic surface branch SA2 at a first side of the lower structure 100. Illustratively, the first side refers to a left side of the lower structure 100 when viewed in a planar view, that is, a side in the x2 direction.

Here, a width W1 of the inorganic surface portion 30 at the first side may be obtained by dividing the sum of the area of the first inorganic surface branch SA1 and the area of the second inorganic surface branch SA2 by the length L1 of the inorganic surface portion 30 at the first side. When the device is manufactured as shown in FIG. 19, the width W1 may also be calculated as the sum of the width W1a of the first inorganic surface branch SA1 and the width W2a of the second inorganic surface branch SA2. This calculation method may be applied to the above example embodiment described with reference to FIG. 16, and may also be applied to one or more example embodiments to be described later with reference to FIGS. 21 to 26.

Although it is shown in FIG. 19 that each of the length of the first inorganic surface branch SA1 in the y1-y2 directions and the length of the second inorganic surface branch SA2 in the y1-y2 directions is equal or substantially equal to the length L1 of the inorganic surface portion 30 at the first side, each of the length of the first inorganic surface branch SA1 in the y1-y2 directions and the length of the second inorganic surface branch SA2 in the y1-y2 directions may be relatively shorter than the length L1 of the inorganic surface portion 30 at the first side. Further, the shape of the organic surface portion Os may be the same or substantially the same shape as a circle in a plan view.

The inorganic surface portion 30 may have a region diverging into the plurality of inorganic surface branches SA1 and SA2 that are spaced from each other. The peripheral region PA may include the organic surface portion Os disposed between the inorganic surface branches SA1 and SA2.

The organic surface portion Os may have a shape protruding upward. Because the organic surface portion Os overlaps with the organic film 213 of the flexible encapsulation multilayer 210 while having a shape protruding upward, the organic surface portion Os may increase the bonding force with the lower structure 100 at the edge of the flexible encapsulation multilayer 210. Further, when the height of the organic surface portion Os is relatively high, the organic surface portion Os may function as a dam to prevent or reduce the organic film 213 from being pushed to the outside by the thermal or physical stress applied to the organic film 213 of the flexible encapsulation multilayer 210.

Figure 21:
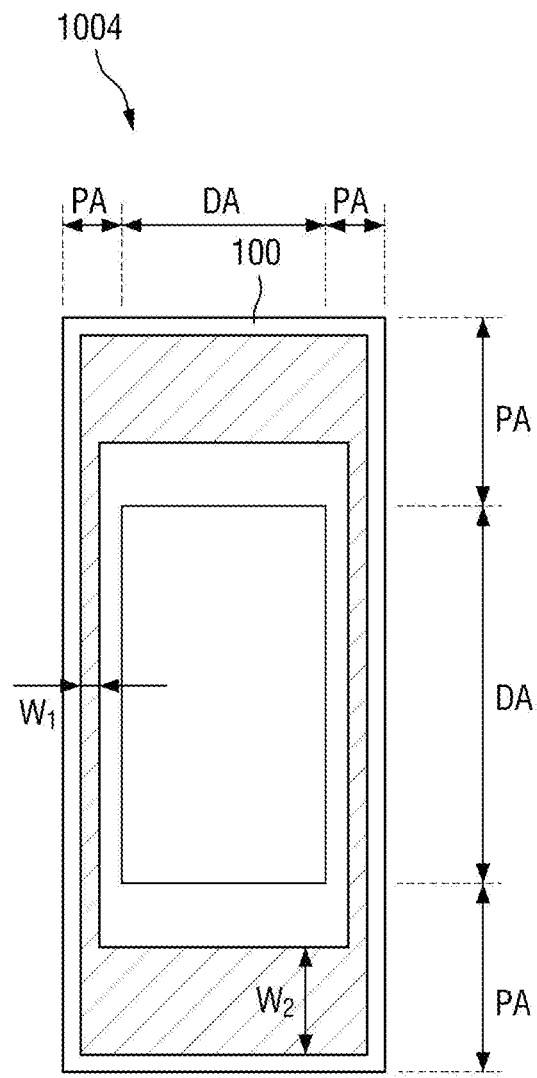
FIG. 21 is a schematic plan view showing a display device according to still another example embodiment of the present invention.

FIG. 21 is a schematic plan view showing a display device according to still another example embodiment of the present invention.

Referring to FIG. 21, a display device 1004 is configured such that the inorganic surface portion 30 has a first width W1 at a first side (or an x2 direction side) having a relatively long length, and has a second width W2, which is relatively larger than the first width W1, at a second side (or a y2 direction side) having a relatively short length. When the display device 1004 is realized as a flexible display device, the degree of bending and unbending (e.g., spreading) at the long side may be relatively smaller than the degree of bending and unbending (e.g., spreading) at the short side, if desired. In this case, because the passing of oxygen and/or moisture between the flexible encapsulation multilayer and the lower structure may more easily occur at the short side compared to at the long side, an effective encapsulating may be achieved by forming the inorganic surface portion 30 to have a larger width at the short side. Because other descriptions of the display device 1004 are substantially the same as those described above with reference to FIGS. 16 and 17, they will be omitted.

Figure 22:
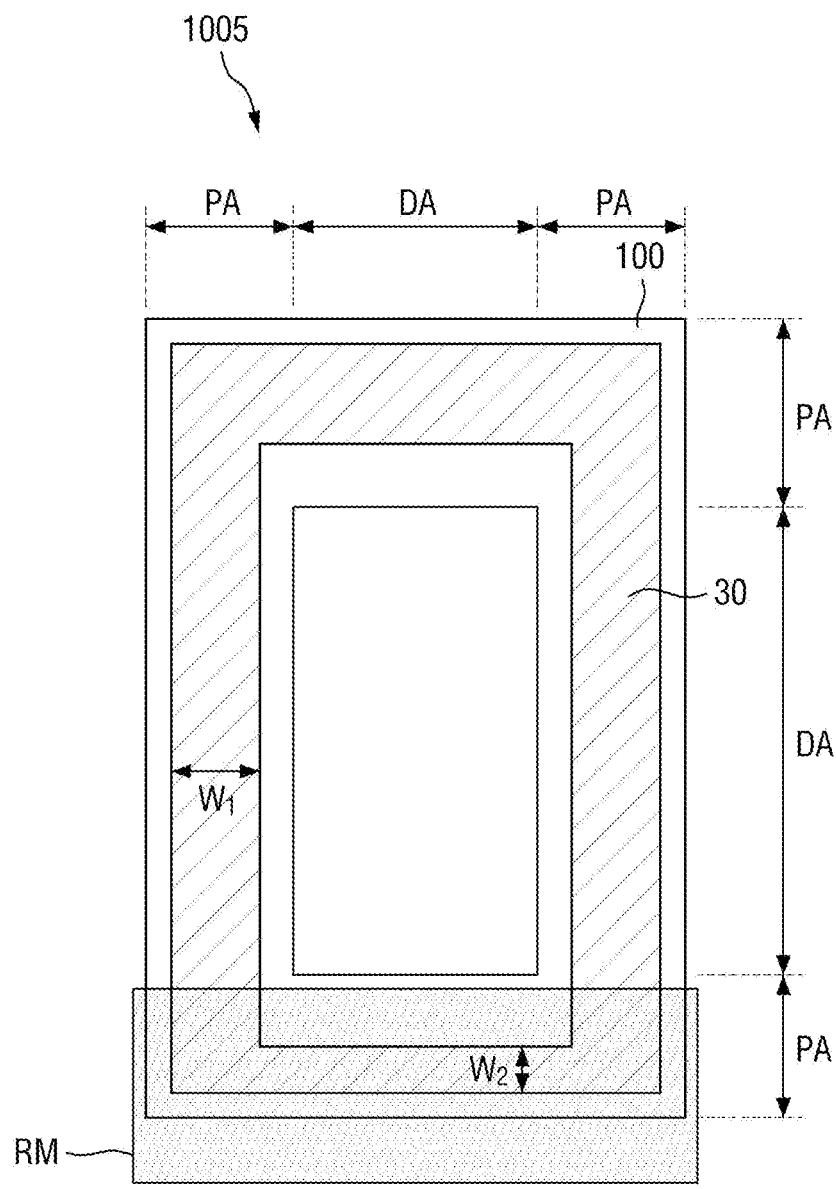
FIG. 22 is a schematic plan view showing a display device according to still another example embodiment of the present invention.

FIG. 22 is a schematic plan view showing a display device according to still another example embodiment of the present invention.

Referring to FIG. 22, a display device 1005 is different from the display device 1002 shown in FIGS. 16 and 17, in that the second side (or y2 direction side) of the inorganic surface portion 30 is fixed by a rigid member RM. Other configurations are the same or substantially same, and thus, repeated description may be omitted.

The rigid member RM is a handle or the like of a display device, and may be disposed only on one side (e.g., the y2 direction side) of the display device 1005 as shown in FIG. 22. Although not show in the drawings, two or more rigid members RM may be provided and fixed at both sides (e.g., the y1 direction side and the y2 direction side) of the display device 1005. Generally, because the degree of bending and unbending (e.g., spreading) of the rigid member RM at the fixed side is relatively lower than the degree thereof at the other sides, relatively, the passing of moisture and/or oxygen may be prevented or reduced, and thus, the width W2 of the inorganic surface portion 30 at the side (e.g., the y2 direction side) fixed by the rigid member RM is relatively smaller than the width W1 of the inorganic surface portion 30 at the other sides (e.g., the x1 direction side or the x2 direction side) not fixed by the rigid member RM, thereby obtaining effective encapsulating.

Figure 23:
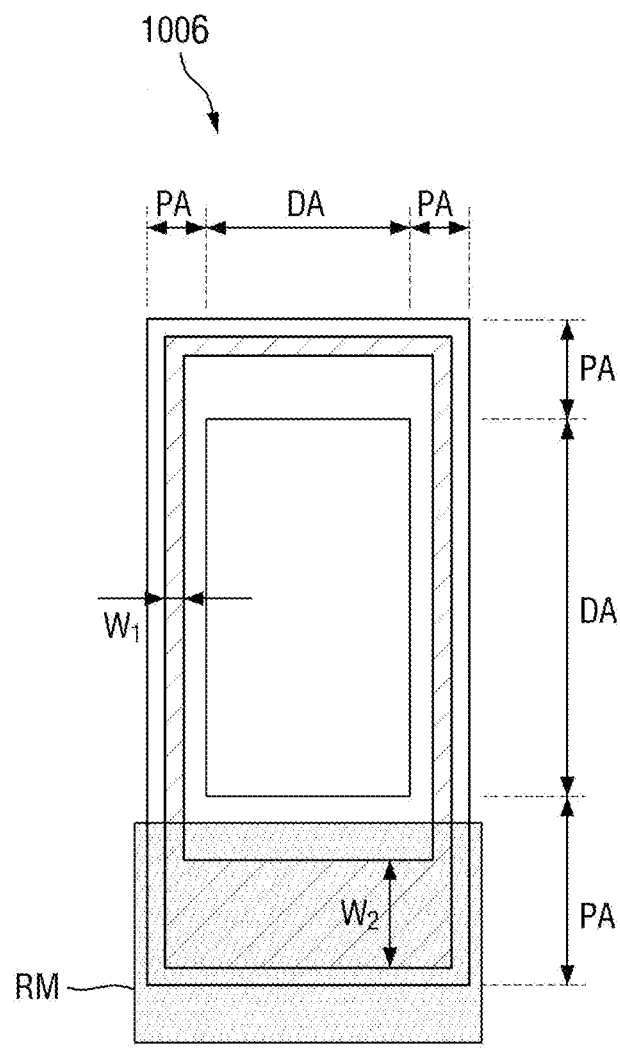
FIG. 23 is a schematic plan view showing a display device according to still another example embodiment of the present invention.
Figure 23:
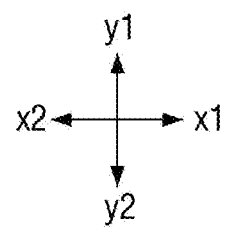

FIG. 23 is a schematic plan view showing a display device according to still another example embodiment of the present invention.

Referring to FIG. 23, a display device 1006 is different from the display device 1004 shown in FIG. 22, in that the width W2 of the inorganic surface portion 30 at the second side (or the y2 direction side) fixed by the rigid member RM is relatively larger than the width W1 of the inorganic surface portion 30 at the side (e.g., the x1 direction side or the x2 direction side) not fixed by the rigid member RM. Other configurations are the same or substantially same, and thus, repeated description may be omitted.

In order to increase the area of the display area DA, there may be a limitation in increasing the width of the side on which the rigid member RM is not fixed. However, because the inorganic surface portion 30 may be inserted into the rigid member RM at the side on which the rigid member RM is fixed, the width of the display area DA may increase. In some cases, the passing of moisture and/or oxygen may occur due to the pressure caused by the rigid member RM and/or the internal structure of the rigid member RM, the internal moisture and/or oxygen atmosphere of the rigid member RM, and/or the internal temperature of the rigid member RM. In this case, it may be desirable for the width W2 of the inorganic surface portion 30 at the side fixed by the rigid member RM to be relatively larger than the width W1 of the inorganic surface portion 30 at the side not fixed by the rigid member RM.

Figure 24:
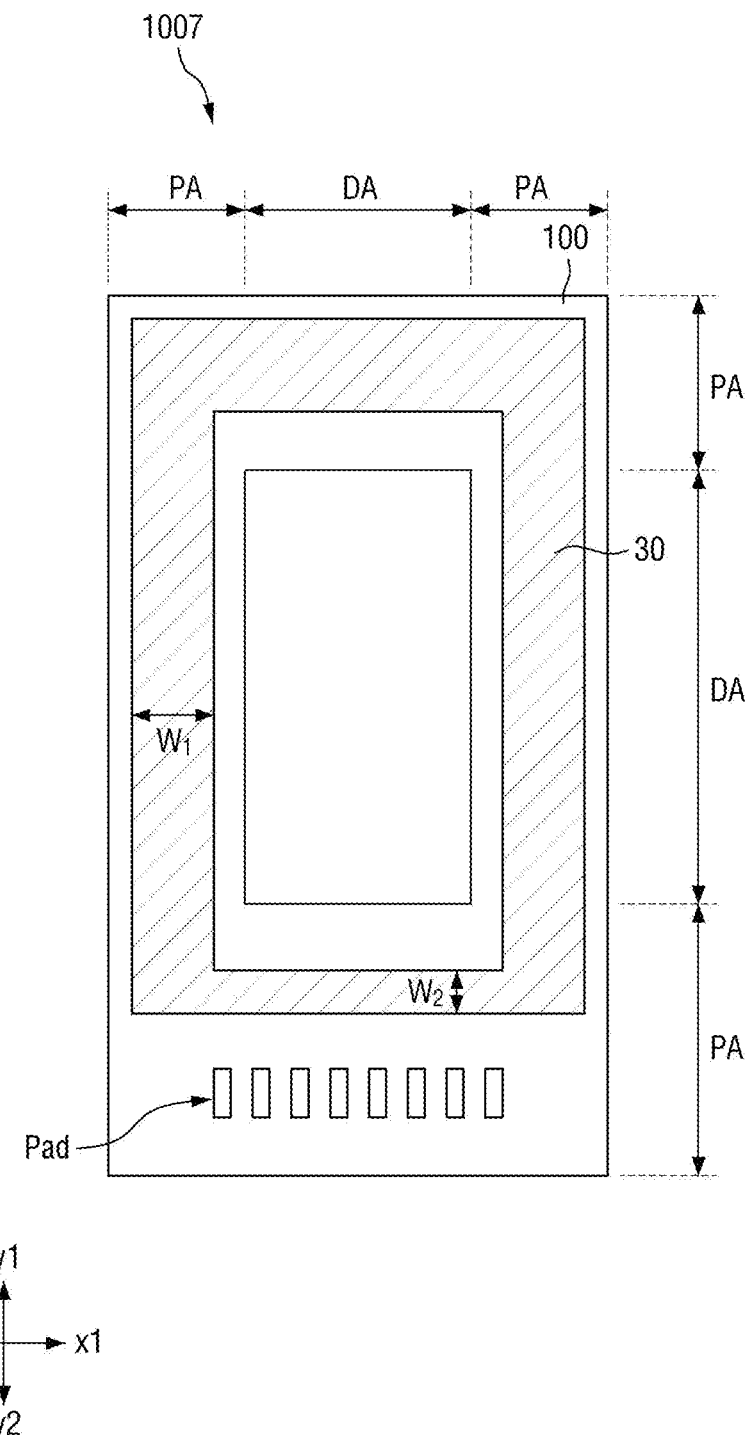
FIG. 24 is a schematic plan view showing a display device according to still another example embodiment of the present invention.

FIG. 24 is a schematic plan view showing a display device according to still another example embodiment of the present invention.

Referring to FIG. 24, a display device 1007 is configured such that at least one pad connected to an external electrical element, such as a flexible printed circuit board (i.e., FPCB), is formed on one side (e.g., the y2 direction side) of the inorganic surface portion 30. In this case, the width W2 of the inorganic surface portion 30 adjacent to the pad at one side (e.g., the y2 direction side) of the display device 1007 is relatively smaller than the width W1 of other portions of the inorganic surface portion 30, thereby securing the area where the pads are disposed without unnecessary or excessive reduction of the display area DA.

Figure 25:
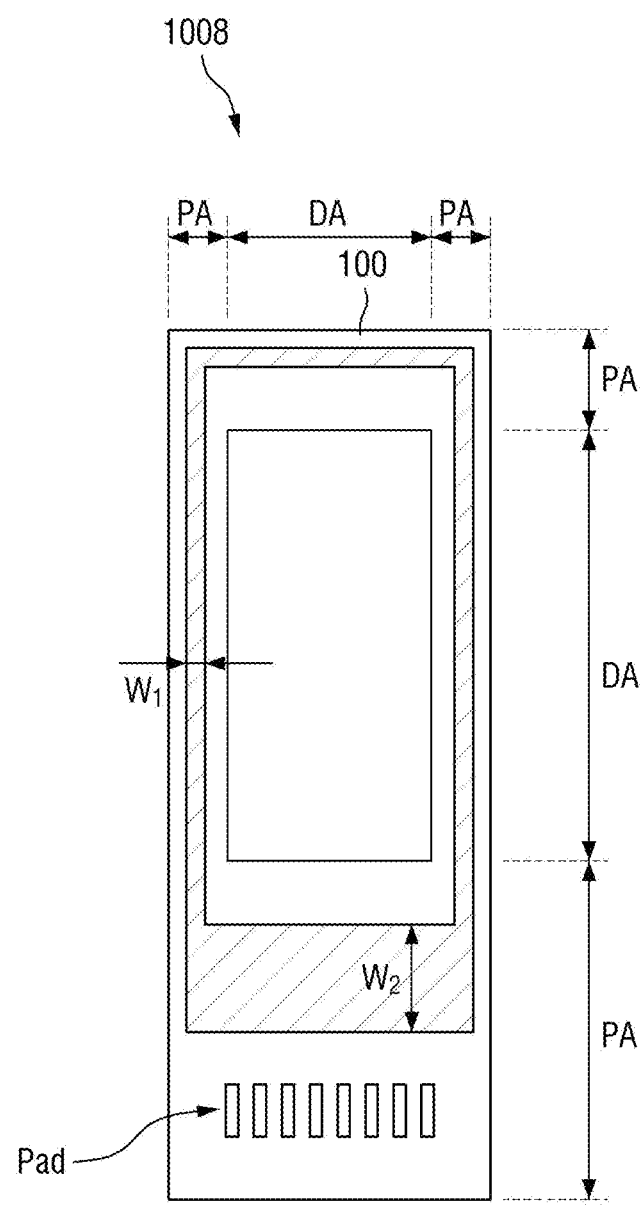
FIG. 25 is a schematic plan view showing a display device according to still another example embodiment of the present invention.

FIG. 25 is a schematic plan view showing a display device according to still another example embodiment of the present invention.

Referring to FIG. 25, a display device 1008 is configured such that at least one pad connected to an external electrical element, such as a flexible circuit board, is formed on one side (e.g., the y2 direction side) of the inorganic surface portion 30. In some cases, a plurality of wirings passes through the inorganic surface portion 30 while overlapping with the inorganic surface portion 30. The wirings may connect a plurality of circuit structures located relatively inner than the inner edge IE of the inorganic surface portion 30 to the pads located relatively outer than the outer edge OE of the inorganic surface portion 30. It may be desired to additionally block moisture, oxygen, impurities, and/or the like that may be introduced from these wirings, and these wirings transmit electrical signals during the operation of the display device, so that thermal expansion or thermal contraction may occur, which may act as an element to increase the passing of moisture and/or oxygen. Therefore, effective encapsulating may be achieved by increasing the width W2 of the portion of the inorganic surface portion 30 adjacent to the pad relative to the width W1 of the other portions.

Figure 26:
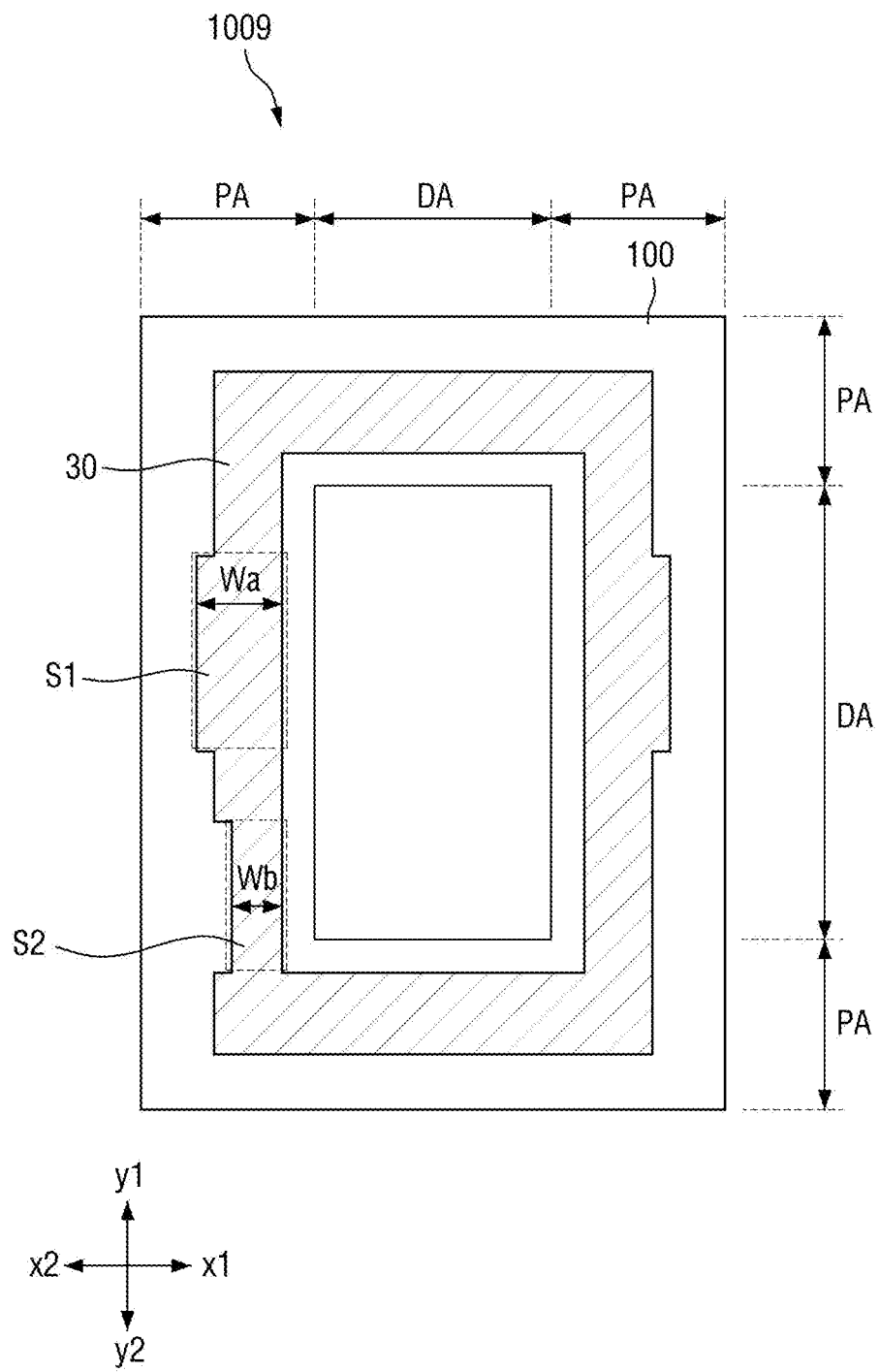
FIG. 26 is a schematic plan view showing a display device according to still another example embodiment of the present invention.

FIG. 26 is a schematic plan view showing a display device according to still another example embodiment of the present invention.

Referring to FIG. 26, a display device 1009 is configured such that the inorganic surface portion 30 located at the same side (e.g., the x2 direction side) of the lower structure 100 includes a first region S1 having a first width Wa along the x1-x2 directions and a second region S2 having a second width Wb relatively smaller than the first width Wa. When repeatedly flexing the display device 1009 by bending and stretching it several times, stress relatively that is larger than that applied to the second region S2 may be applied to the first region S1 adjacent to the bending axis which bisects the display device 1009 along the horizontal direction (e.g., the x1-x2 directions). Therefore, the first width Wa of the first region S1, which receives more stress, may be relatively wider than the second width Wb of the second region S2, thereby effectively preventing or reducing the inflow of moisture and/or oxygen. The width of each region of the inorganic surface portion 30 located at the same side of the display device 1009 may be adjusted depending on the stress (e.g., amount of the stress and/or location of the stress). In addition, changes in the widths of the respective regions of the inorganic surface portion 30 are possible considering design requirement, in addition to the case of considering the stress.

The example embodiments described in FIGS. 21 to 26 are difficult to be implemented by irradiating a sealant region with a laser. When trying to implement the example embodiments described in FIGS. 21 to 26 with a laser sealing method, the width of a laser beam should be changed in order to adjust the width of the inorganic surface portion 30 and the contact area between the inorganic surface portion 30 and the lower surface of the flexible encapsulation multilayer. The change in the width of a laser beam causes a loss because a laser irradiation device and a laser irradiation process should be also changed. Further, as shown in FIG. 26, the change in the width of the inorganic surface portion 30 for each region at one side of the display device 1009 is more difficult to implement. One method to form sealant portions having widths different from each other by using a laser beam having the substantially same width is varying laser irradiation times from regions to regions. In this case, to make a width of a part of the sealant portion wider, the part should be irradiated with the laser for a relatively longer time. Therefore, thermal damage may be applied to circuits, wirings and insulation films adjacent to the sealant portion having a relatively large width, and thus this is not preferable.

As described above, when changing the width of the sealant portion through single laser beam irradiation, the first width Wa may not be formed at a level of about 110% or more of the second width Wb. In addition, because damages may be applied to peripheral circuits, wirings, and/or insulating films in the process, the reliability of the display device may be deteriorated.

On the other hand, according to one or more example embodiments of the present invention, the first width Wa may be increased to a level of about 110% or more of the second width Wb without laser beam irradiation. In this case, because a laser beam irradiation process is not used, thermal damage may not occur in the peripheral structures.

In more detail, although not shown in the drawings, the adhesion increasing recesses that are described in FIGS. 1 to 15 may be formed selectively or more intensively in a portion having a relatively wide width in FIGS. 21 to 26. The term "selectively" refers to that the adhesion increasing recesses are formed only in that portion, and the term "more intensively" refers to that the adhesion increasing recesses are formed in that portion at a high density, although they may be formed in other portions as well. In other words, at a region where the adhesion increasing recesses are formed densely, the gaps among the adhesion increasing recesses are comparatively narrow, and at a region where the adhesion increasing recesses are formed less densely, the gaps among the adhesion increasing recesses are comparatively wide. Further, in some cases, the width of the corner may be made larger or narrower, the adhesion increasing recesses may be formed only at the corner, and the adhesion increasing recesses may be formed more densely or less densely at the corner.

Figure 27:
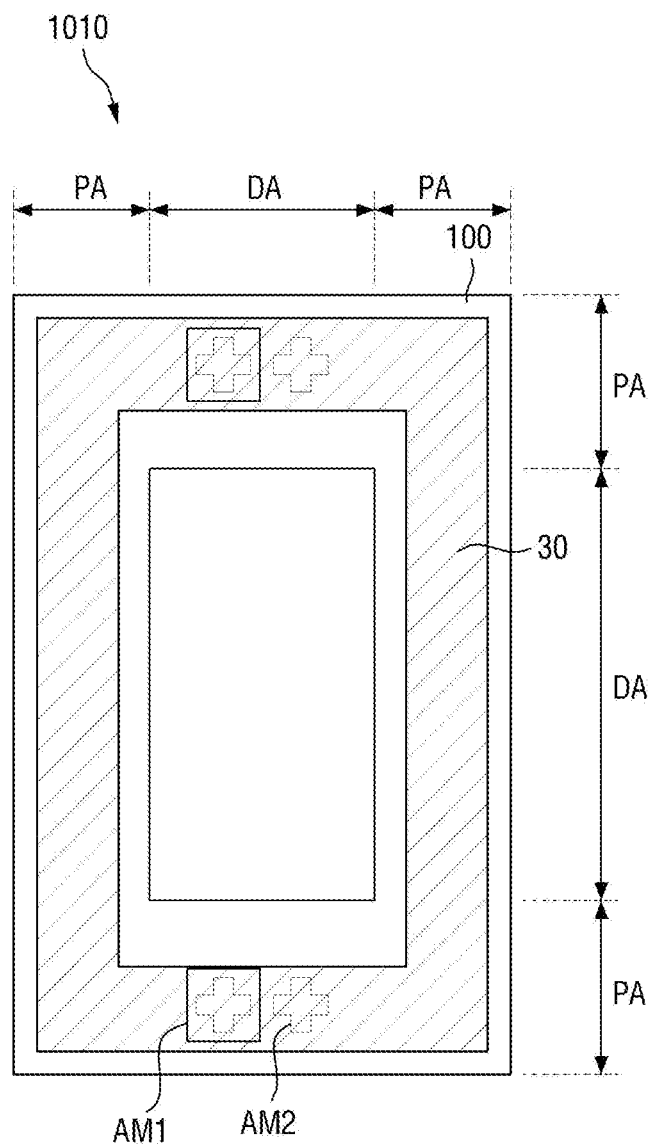
FIG. 27 is a schematic plan view showing a display device according to still another example embodiment of the present invention.
Figure 28:
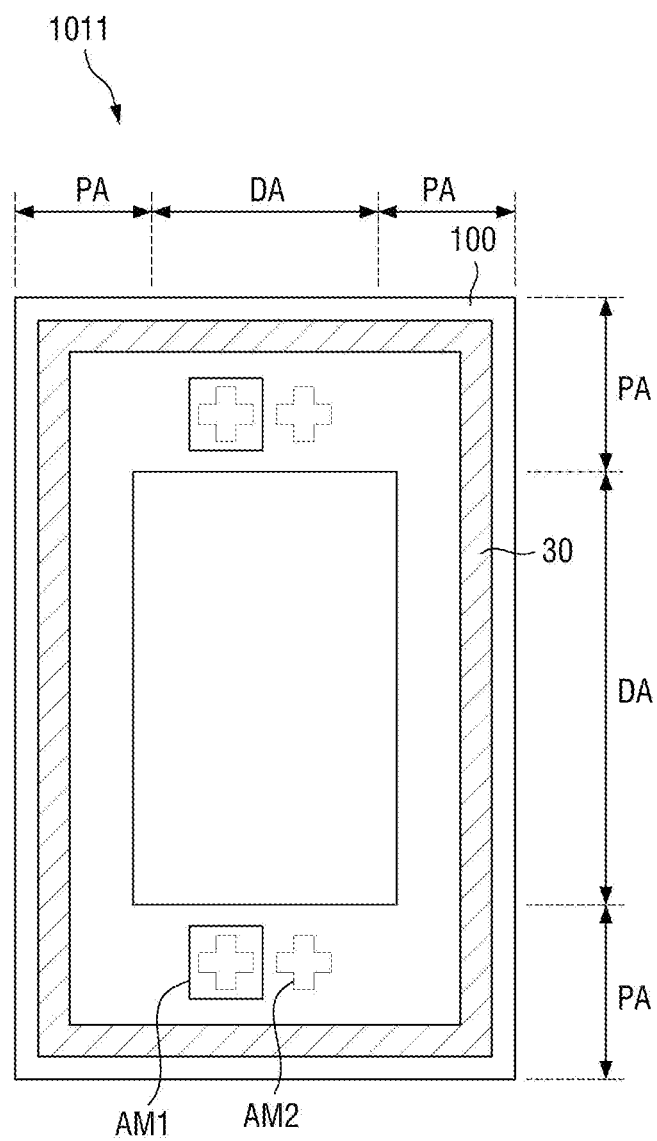
FIG. 28 is a schematic plan view showing a display device according to still another example embodiment of the present invention.

FIG. 27 is a schematic plan view showing a display device according to still another example embodiment of the present invention. FIG. 28 is a schematic plan view showing a display device according to still another example embodiment of the present invention, which is a plan view showing a modified structure of FIG. 27.

Referring to FIG. 27, a display device 1010 includes an alignment mark AM1 or AM2. The alignment mark AM1 or AM2 is located relatively inward relative to the outer edge of the inorganic surface portion 30. At a planar view, the alignment mark AM1 or AM2 is disposed to overlap with the inorganic surface portion 30. Therefore, the area of the peripheral area PA may be effectively reduced compared to when the alignment mark AM1 or AM2 is disposed relatively outward relative to the outer edge of the inorganic surface portion 30.

The alignment mark AM1 or AM2 may be an inorganic material pattern having optical reflectivity, for example, a metal pattern. Thus, the alignment mark AM1 or AM2 is easy to optically discriminate. However, the alignment mark AM1 or AM2 is not particularly limited as long as it may be optically left-right discriminated, and may be cross-shaped in some example embodiments.

The alignment mark AM1 or AM2 may be a first alignment mark AM1 or a second alignment mark AM2. The first alignment mark AM1 may be a hole formed through a metal film, and the second alignment mark AM2 is a metal pattern having no hole. The display device 1010 may include both the first and second alignment marks AM1 and AM2. Alternatively, the display device 1010 may include one of the first and second alignment marks AM1 and AM2.

When the first alignment mark AM1 is employed in the display device 1010, the first alignment mark AM1 may be a hole formed through a dummy metal film. Alternatively, the hole may also be formed by drilling a metal film, such as a wire for transmitting an electric signal for driving the electroluminescent unit EU. In the case of forming the first alignment marks AM1 by drilling a separate wire or the like, a space may be advantageously saved as compared to the case of forming a separate dummy metal film.

For example, the first alignment mark AM1 may be formed through the bus wire 109b of FIGS. 17 and 20. In this case, the adhesion increasing recess 50a shown in FIG. 1 may also be formed through the bus wire 109b. That is, although a plurality of holes are formed through the bus wire 109b, some of the holes may be used as the adhesion increasing recess 50a, and others of the holes may be used as the first alignment mark AM1. Here, the holes used as the first alignment mark AM1 as well as the holes used as the adhesion increasing recess 50a may improve adhesion. In this case, the planar shape of the adhesion increasing recess 50a and the planar shape of the first alignment mark AM1 may be different from each other.

The upper surface or lateral surface of the first alignment mark AM1 may be included in the inorganic surface portion 30 to be in contact with the bottom surface of the flexible encapsulation multilayer 210. In this case, the first alignment mark AM1 serves as a kind of unevenness to increase the adhesion with the flexible encapsulation multilayer 210.

When the first alignment mark AM1 is formed through the bus wire 109b, as shown in FIG. 18, the first alignment mark AM1 may be formed under the inorganic surface portion 30. In this case, the first alignment mark AM1 may not be damaged in the process of forming the flexible encapsulation multilayer 210. Even in this case, the adhesion increasing recess 50a may be additionally formed in the bus wire 109b. Even if the adhesion increasing recess 50a is not in direct contact with the inorganic surface portion 30, it is located under the inorganic surface portion 30, so that the inorganic surface portion 30 may be provided with unevenness indirectly. That is, referring to FIG. 18, the surface of the inorganic film 114 included in the inorganic surface portion 30 may be provided with unevenness due to the adhesion increasing recess 50a formed through the bus wire 109b.

FIG. 28 is a plan view showing a modified structure of FIG. 27. As shown in FIG. 28, a display device 1011, unlike the display device 1010 shown in FIG. 27, is configured such that the alignment mark AM1 or AM2 is disposed inward (e.g., more toward a center of the display device 1011) relative to an inner edge IE of the inorganic surface portion 30, which is opposite to an outer edge OE of the inorganic surface portion 30.

Because the display device 1011 is configured such that the alignment mark AM1 or AM2 is disposed closer to the display area DA, more precise alignment may be possible in the alignment process necessary for forming the display area DA.

Details of the alignment mark AM1 or AM2 will not be repeated because they are substantially the same or substantially the same as those described with reference to FIG. 27.

Figure 29:
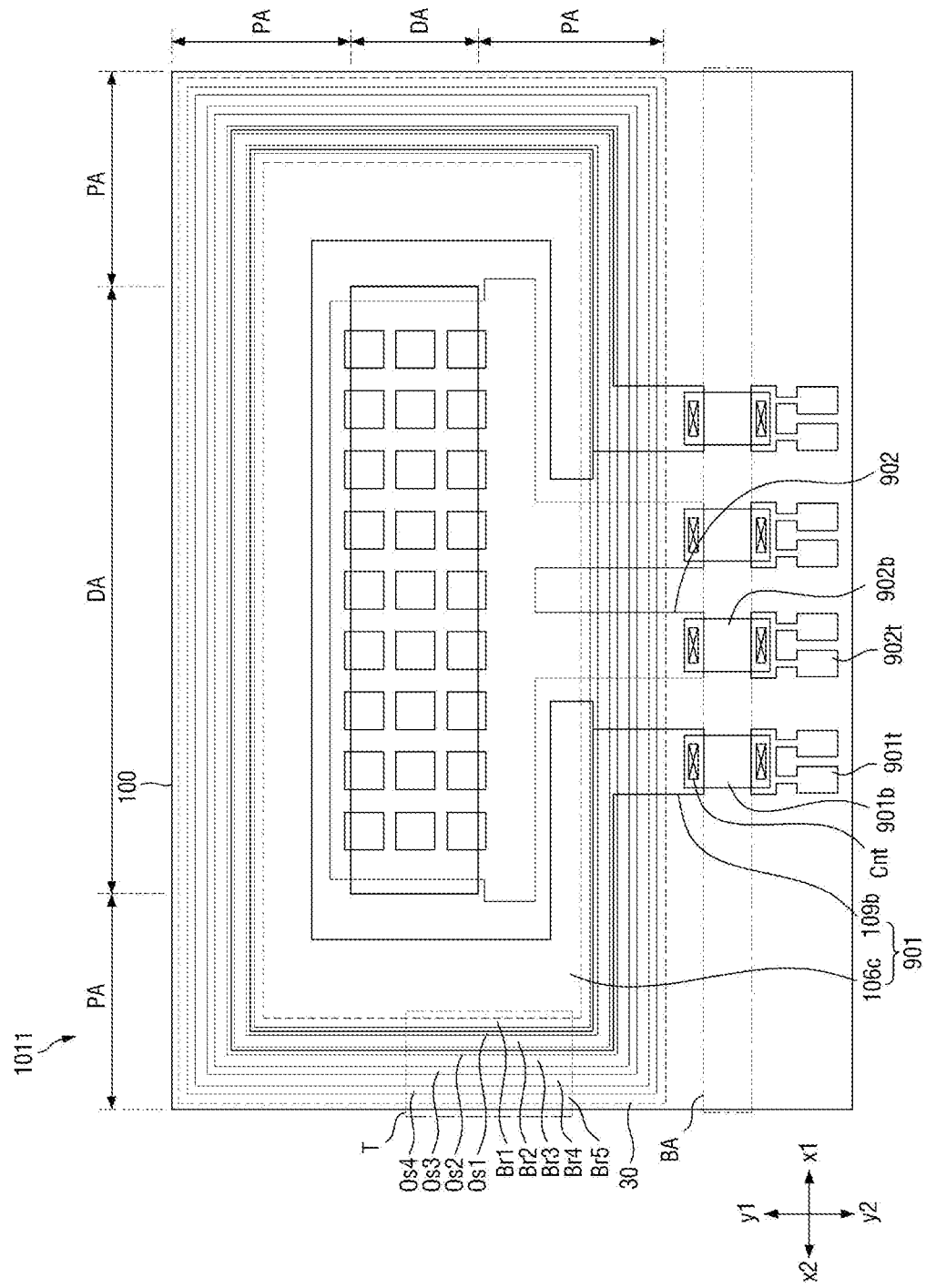
FIG. 29 is a schematic plan view showing a display device according to still another example embodiment of the present invention.
Figure 30:
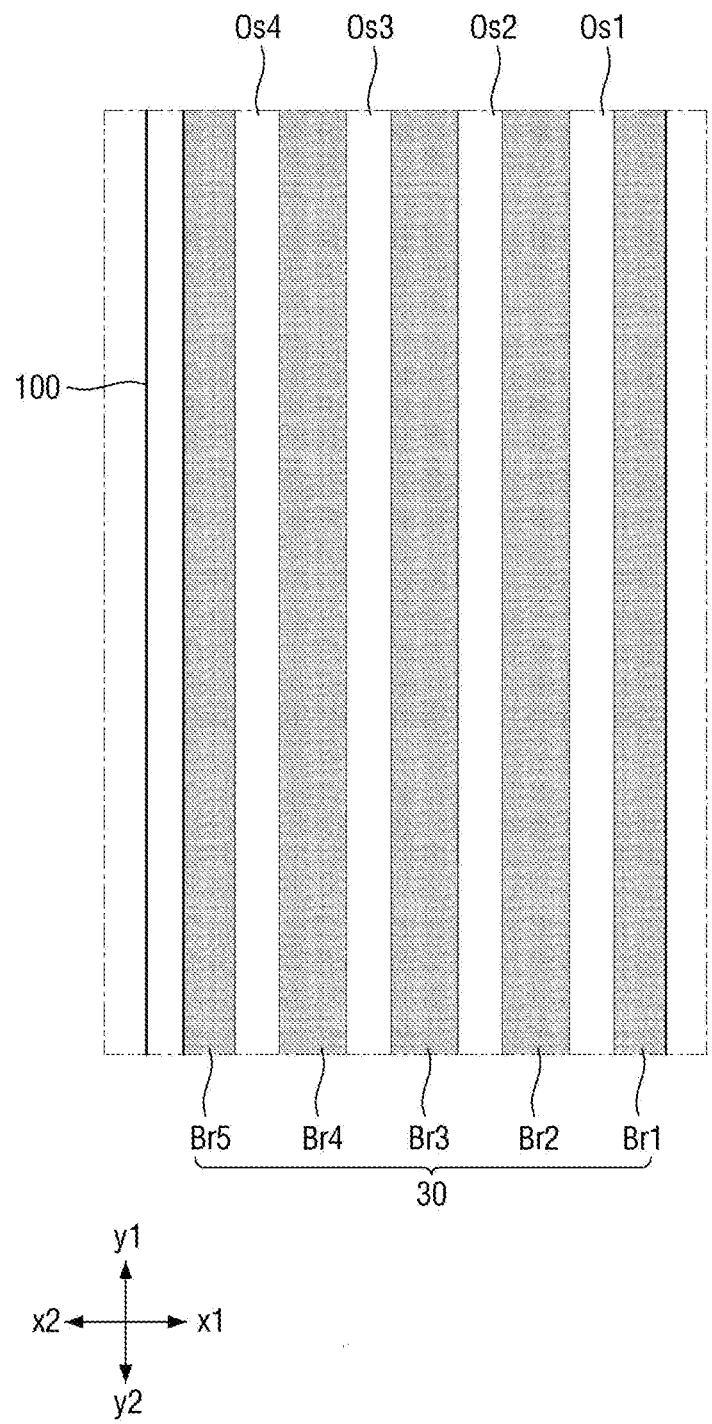
FIG. 30 is an enlarged view of the area T of FIG. 29.

FIG. 29 is a schematic plan view showing a display device according to still another example embodiment of the present invention, and FIG. 30 is an enlarged view of the area T of FIG. 29.

Referring to FIGS. 17, 29, and 30, the display device 1011 includes an upper electrode power supply wire 901 electrically connected to the upper electrode 125 of the electroluminescent unit EU to apply an electric signal to the upper electrode 125, and a lower electrode power supply wire 902 electrically connected to the lower electrode 121 of the electroluminescent unit EU to apply an electric signal to the lower electrode 121. Here, the upper electrode power supply wire 901 may include a bus wire 109b and an auxiliary upper electrode 106c.

An upper electrode power supply terminal 901t and a lower electrode power supply terminal 902t are located at the ends of the upper electrode power supply wire 901 and the lower electrode power supply wire 902, respectively.

The upper electrode power supply terminal 901t and the lower electrode power supply terminal 902t may be disposed along one direction (e.g., the x1-x2 directions). Further, the upper electrode power supply terminal 901t and the lower electrode power supply terminal 902t may be electrically connected to one external circuit board. Here, an example of the external circuit board may be a flexible circuit board.

The peripheral area PA may have a bendable area BA. For example, the bendable area BA may be provided between the display area DA and at least one of the lower electrode power supply terminal 902t and the upper electrode power supply terminal 901t.

When the bendable area BA is bent, the external circuit board connected to at least one of the lower electrode power supply terminal 902t and the upper electrode power supply terminal 901t may be fixed on a back surface of the display device 1011.

The lower electrode power supply wire 902 and the upper electrode power supply wire 901 may include a conductive bridge 902b and a conductive bridge 901b. The conductive bridges 902b and 901b may have contacts Cnt and cross the bendable area BA. The conductive bridge 902b may be located on a different layer from a portion of the adjacent lower electrode power supply wire 902. Similarly, the conductive bridge 901b may be located on a different layer from a portion of the adjacent upper electrode power supply wire 901. When the conductive bridges 902b and 901b are used, the bendable area BA may be bent more easily.

Although not specifically shown in the drawings, the sum of the thicknesses of insulating layers in the bendable area BA is made relatively smaller than the sum of the thicknesses of the insulating layers in the peripheral area PA adjacent to the bendable area BA, to bend the bendable region BA more easily.

The peripheral area PA has an inorganic surface portion 30 of a closed shape surrounding (e.g., continuously surrounding) the display area DA.

The inorganic surface portion 30 has a region that is branched into a plurality of inorganic surface branches Br1, Br2, Br3, Br4 and Br5 that are spaced from each other.

The peripheral area PA may include organic surface portions Os1, Os2, Os3 and Os4 located between the inorganic surface branches Br1, Br2, Br3, Br4 and Br5 of the inorganic surface portion 30. Here, the organic surface portions Os1, Os2, Os3 and Os4 are surrounded (e.g., completely surrounded) by the inorganic-inorganic direct bonding between the lower surface of the flexible encapsulation multilayer 210 and the inorganic surface portion 30. These organic surface portions Os1, Os2, Os3 and Os4 absorb the impurities that may move along the interface between the lower surface of the flexible encapsulation multilayer 210 and the inorganic surface portion 30, and then keep holding these impurities, thereby lowering the concentration of the impurities existing at the interface between the lower surface of the flexible encapsulation multilayer 210 and the inorganic surface portion 30. Therefore, the reliability of the inorganic-inorganic direct bonding may increase.

When the organic surface portions Os1, Os2, Os3 and Os4 are relatively far from the impurities that may exist at the interface where the inorganic surface portion 30 and the lower surface of the flexible encapsulation multilayer 210 make the inorganic-inorganic direction bonding, the impurities may be concentrated on a certain part of the interface before the impurities move to the organic surface portions Os1, Os2, Os3 and Os4. Therefore, the bonding force of the inorganic-inorganic direct bonding decreases. In addition, these impurities move to the display area DA before the impurities move to the organic surface portions Os1, Os2, Os3 and Os4. Therefore, an intermediate layer included in the electroluminescent unit EU located in the display area DA is deteriorated.

When the display area DA has a flexible portion and the flexible portion is bent and then unbent (e.g., stretched) repeatedly or folded and stretched repeatedly, it more frequently occurs that the impurities are concentrated at a part (or portion) of the interface or the impurities move to the display area DA.

Here, the case of the display area DA having a flexible portion refers to that the lower structure 100 may be used as any one of a bendable display substrate, a foldable display substrate, a rollable display substrate, a stretchable display substrate, and a flexible display substrate. However, the present invention is not limited thereto, and one or more example embodiments of the present invention may be applied even to a display device employing the flexible encapsulation multilayer 210 while having no flexible portion. Illustratively, example embodiments of the present invention may be applied even to a flat display device having a flexible encapsulation multilayer and fixed to a flat rigid window and a curved display device having a flexible encapsulation multilayer and fixed to a curved rigid window.

In order to reduce the distance between the organic surface portions Os1, Os2, Os3 and Os4 and the impurities located at the interface formed by the inorganic-inorganic direct bonding, the organic surface portions Os1, Os2, Os3 and Os4 may have a shape that surrounds or substantially surrounds the display area DA.

Figure 31:
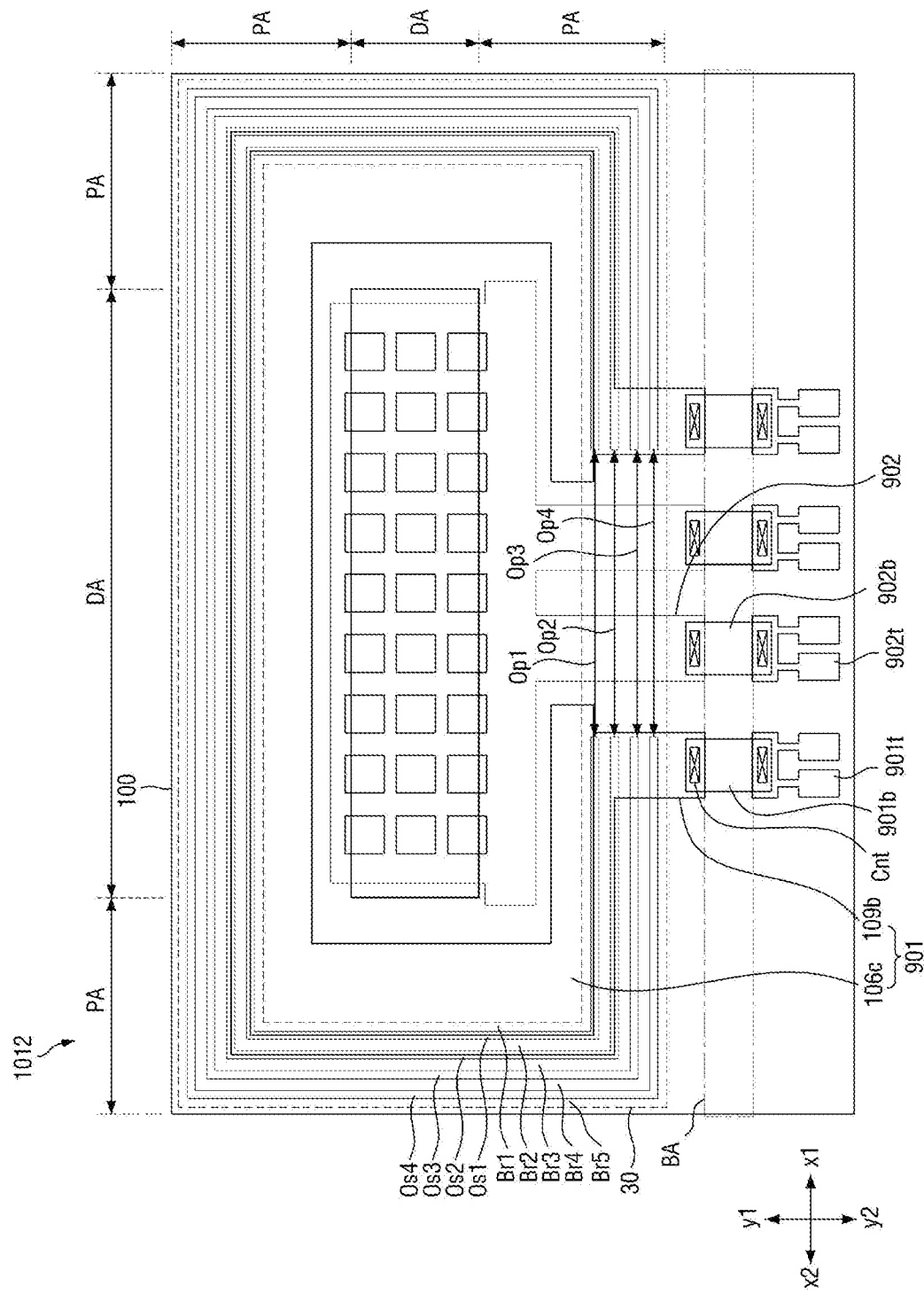
FIG. 31 is a schematic plan view showing a display device according to still another example embodiment of the present invention.
Figure 32:
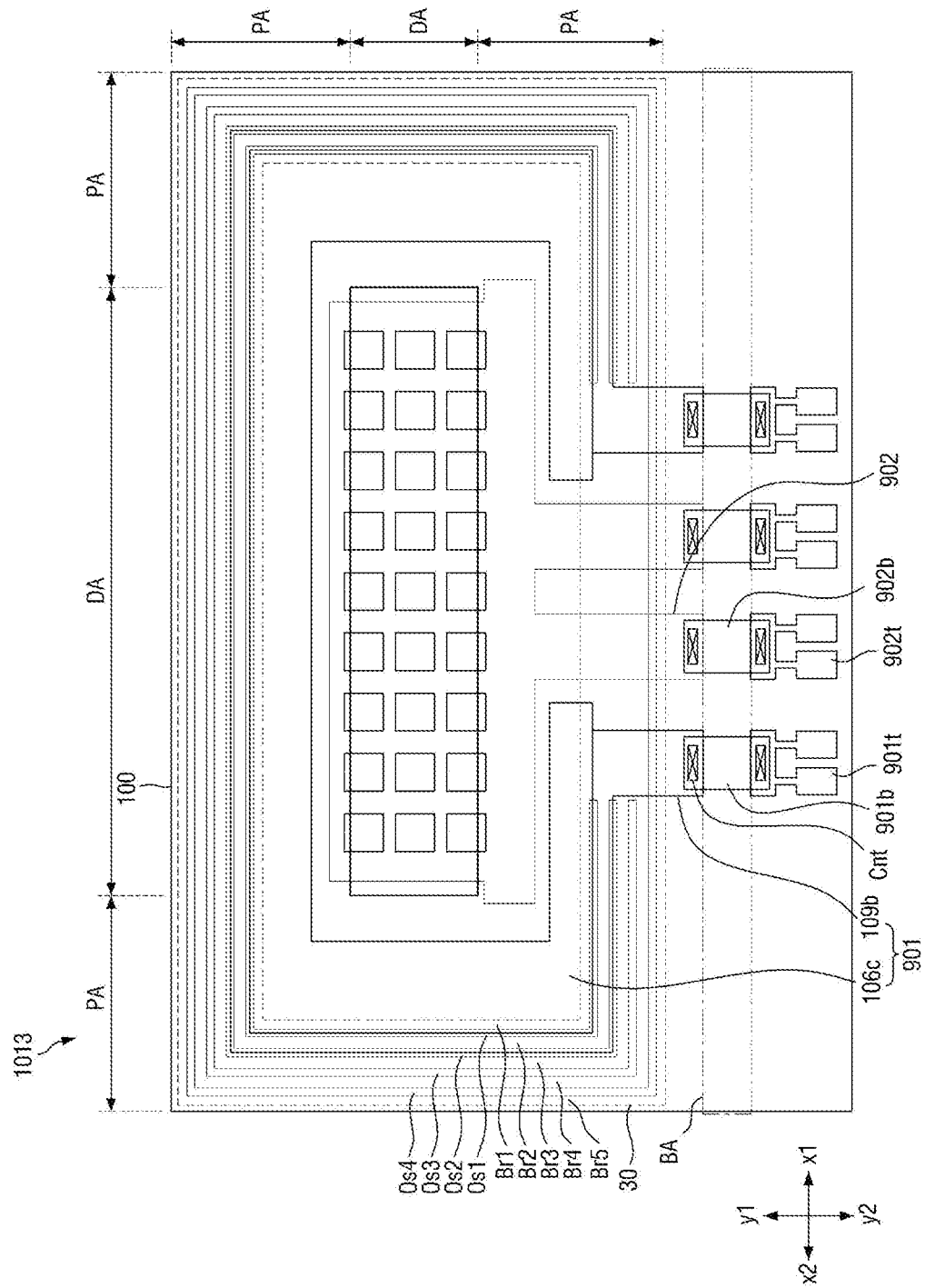
FIG. 32 is a schematic plan view showing a display device according to still another example embodiment of the present invention.
Figure 33:
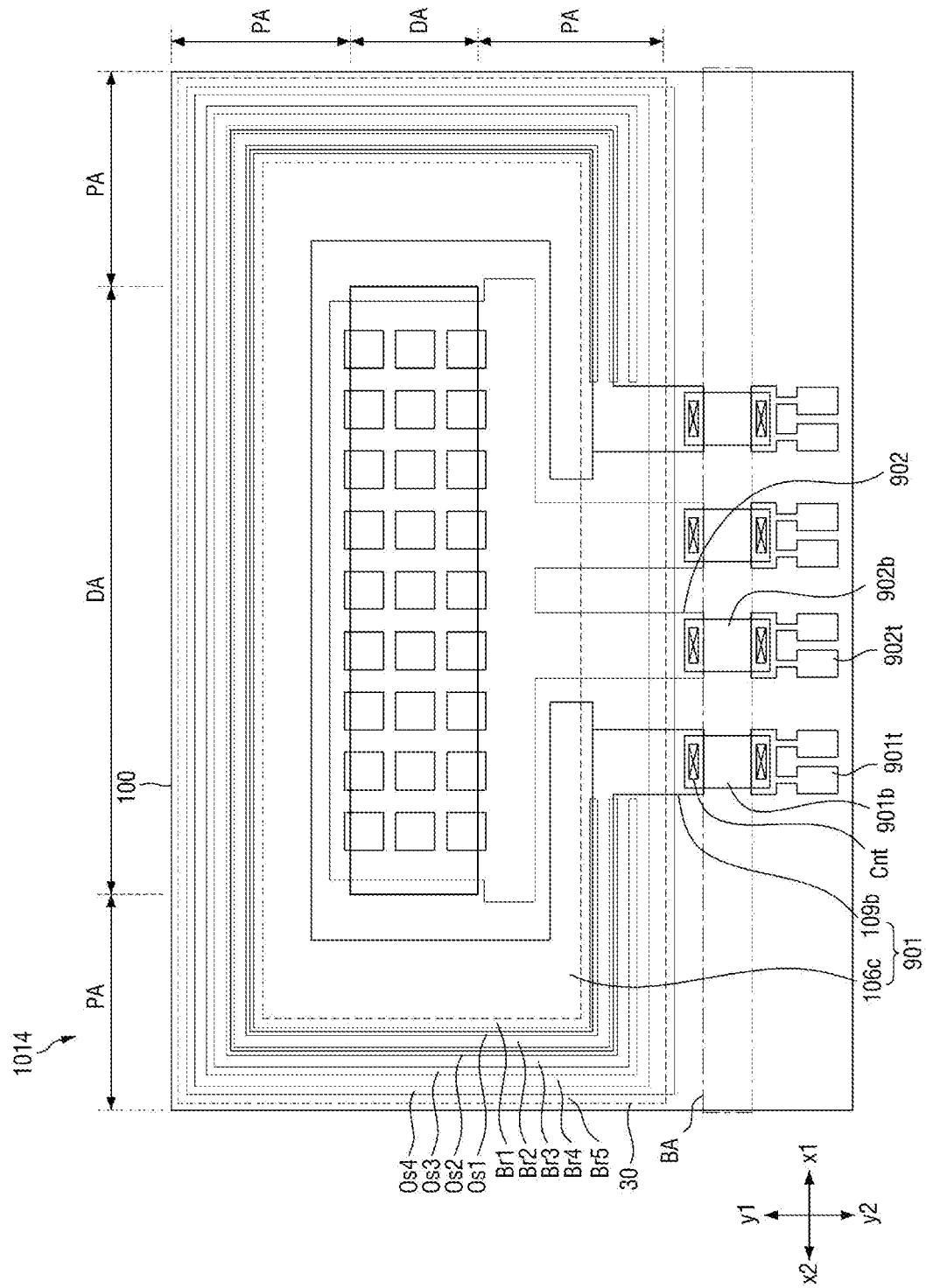
FIG. 33 is a schematic plan view showing a display device according to still another example embodiment of the present invention.

Here, the meaning of that phrase the organic surface portions Os1, Os2, Os3 and Os4 "surrounds or substantially surrounds the display area DA" includes not only the case of the organic surface portions Os1, Os2, Os3 and Os4 shown in FIG. 29, the organic surface portion 0s4 shown in FIG. 32, and the organic surface portion Os4 shown in FIG. 33, which continuously surround the display area DA, but also the case of the organic surface portions Os1, Os2, Os3 and Os4 shown in FIG. 31, the organic surface portions Os1, Os2, and Os3 shown in FIG. 32, and the organic surface portions Os1, Os2, and Os3 shown in FIG. 33., which discontinuously surround the display area DA.

When the display area DA has a shape having two or less outer sides, such as a circle, an ellipse, and a semicircle, for example, the case of the organic surface portion Os continuously or discontinuously surrounding the display area DA refers to that the organic surface portion Os continuously or discontinuously extends to correspond to ¼ or more of the entire outer periphery of the display area DA. Further, when the shape of the display area DA is a triangle, for example, the case of the organic surface portion Os continuously or discontinuously surrounding the display area DA refers to that the organic surface portion Os continuously or discontinuously extends to correspond to at least one outer side of the display area DA. Furthermore, when the shape of the display area DA is a square, a pentagon, a hexagon, or the like, the case of the organic surface portion Os continuously or discontinuously surrounding the display area DA refers to that the organic surface portion Os continuously or discontinuously extends to correspond to at least two outer sides of the display area DA.

Because the organic surface portions Os1, Os2, Os3 and Os4 are surrounded (e.g., completely surrounded) by the inorganic-inorganic direct bonding at a planar view, they do not communicate with the outside of the display device 1011. Therefore, moisture or impurities may not be supplied to the interface formed by the inorganic-inorganic direct bonding from the outside of the display device through the organic surface portions Os1, Os2, Os3 and Os4.

Each of the organic surface portions Os1, Os2, Os3 and Os4 may have a sectional shape protruding upward. Further, each of the organic surface portions Os1, Os2, Os3 and Os4 may have various shapes, such as, for example, an island shape, a shape extending along the direction in which the inorganic surface portion 30 extends, and the like.

The height of the organic surface portions Os1, Os2, Os3 and Os4 may be the same or substantially the same as the height of the pixel defining layer 117. Although not shown, the height of the pixel defining layer 117 may include the height of a spacer protruding upward from the top of the pixel defining layer 117.

When the height of the organic surface portions Os1, Os2, Os3 and Os4 may be substantially the same as the height of the pixel defining layer 117, the organic surface portions Os1, Os2, Os3 and Os4 may be used as spacers that may be in contact with an evaporation mask in a vacuum evaporation process for forming the intermediate layer of the electroluminescent unit EU. In more detail, the hole injection layer (HIL), hole transport layer (HTL), electron injection layer (EIL) and electron transport layer (ETL) included in the intermediate layer may be formed as a common layer. In this case, the organic surface portion may be used as a spacer of an open evaporation mask.

As described above, the organic surface portions Os1, Os2, Os3 and Os4 may have a closed loop shape surrounding (e.g., continuously surrounding) the display area DA. In this case, because an entire edge of the deposition mask may correspond to the organic surface portions Os1, Os2, Os3 and Os4, the organic materials passing through the evaporation mask may not escape from the space defined by a deposition target region of the lower structure 100, the evaporation mask, and the organic surface portions Os1, Os2, Os3 and Os4 during the evaporation process.

FIG. 31 is a schematic plan view showing a display device according to still another example embodiment of the present invention. Referring to FIG. 31, a display device 1012 is different from the display device 1011 of FIGS. 29 and 30, as the shape of the organic surface portions Os1, Os2, Os3 and Os4 are different. In more detail, the organic surface portions Os1, Os2, Os3 and Os4 of the display device 1012 may have an opened loop shape. For example, the organic surface portions Os1, Os2, Os3 and Os4 may be opened by at least one of openings Op1, Op2, Op3 and Op4 in order to discontinuously surround the display area DA. When the inorganic surface branches Br1, Br2, Br3, Br4 and Br5 of the inorganic surface portion 30 are not connected to each other, at least one of the inorganic surface branches Br1, Br2, Br3, Br4 and Br5 of the inorganic surface portion 30 may be independently detached from the lower surface of the flexible encapsulation multilayer 200 when excessive physical stress is applied to the display device 1012. However, according to example embodiments of the present invention, because the inorganic surface branches Br1, Br2, Br3, Br4 and Br5 of the inorganic surface portion 30 are connected to each other, the inorganic direct bonding may be effective.

When the organic surface portions Os1, Os2, Os3 and Os4 have an open loop shape, there are no organic surface portions Os1, Os2, Os3 and Os4 in regions of the inorganic surface portion 30 corresponding to the openings Op1, Op2, Op3 and Op4. Accordingly, impurities located at the bonding interface in the regions of the inorganic surface portion 30 corresponding to the openings Op1, Op2, Op3 and Op4 may be easily concentrated on a certain part of the interface. Therefore, the bonding force of the inorganic surface portion 30 may be relatively lower than a case where there is no the openings Op1, Op2, Op3 and Op4. Therefore, the width of the inorganic surface portion 30 at the first side (illustratively, in the y2 direction side) of the lower structure 100 provided with the openings Op1, Op2, Op3 and Op4 may be relatively larger than the width of the inorganic surface portion 30 at the second side (illustratively, in the x2 direction side) of the lower structure 100 not provided with the openings Op1, Op2, Op3 and Op4. Thus, the bonding force at the first side (e.g., the y2 direction side) of the lower structure 100 may be enhanced.

FIG. 32 is a schematic plan view showing a display device according to still another example embodiment of the present invention. Referring to FIG. 32, a display device 1013 is different from the display device 1012 of FIG. 31, as the shape of the organic surface portions Os1, Os2, Os3 and Os4 are different.

Referring to FIG. 32, the lower structure 100 of the display device 1013 may include organic surface portions Os1, Os2, and Os3 each having an open loop shape and an organic surface portion Os4 having a closed loop shape.

FIG. 33 is a schematic plan view showing a display device according to still another example embodiment of the present invention. Referring to FIG. 33, a display device 1014 is different from the display device 1013 of FIG. 32, as the shape of the organic surface portion Os4 is different.

Referring to FIG. 33, when some organic surface portions Os1, Os2, and Os3 of the organic surface portions Os1, Os2, Os3 and Os4 are surrounded (e.g., completely surrounded) by the direct bonding between the lower surface of the flexible encapsulation multilayer 210 and the inorganic surface portion 30 at a planar view, the remaining organic surface portion Os4 may communicate with the outside of the display device 1014.

In more detail, the lower structure 100 may include a first organic surface portion Os4 having a closed loop shape that communicates with the outside and second organic surface portions Os1, Os2, and Os3 that are disposed between the first organic surface portion Os4 and the display area DA. The second organic surface portions Os1, Os2, and Os3 may have an open loop shape and may be surrounded (e.g., completely surrounded) by the direction bonding between the lower surface of the flexible encapsulation multilayer 200 and the inorganic surface portion 30 at a planar view.

In this case, the height of the first organic surface portion Os4 is the same or substantially the same as that of the pixel defining layer 117, and thus may serve as a spacer for the evaporation mask. The widths of the second organic surface portions Os1, Os2, and Os3 may be effectively lowered by making the height of the second organic surface portions Os1, Os2, and Os3 relatively lower than the height of the first organic surface portion Os4. Therefore, the width of the peripheral area PA may be narrowed.

The organic surface portions Os1 and Os2 may extend to cover the lateral sides of wirings. The wirings may be a conductive multilayer. Because the lateral portions of the conductive multilayer are susceptible to corrosion because a plurality of interfaces are exposed, the organic surface portions Os1 and Os2 may prevent or reduce the corrosion of the conductive multilayer by covering the lateral sides of the conductive multilayer. In addition, the organic surface portions Os1 and Os2 may absorb the impurities, such as moisture, oxygen, and the like, which may be discharged from the interfaces exposed at the lateral sides of the conductive multilayer, and may hold these impurities.

As an example, the conductive multilayer may be an auxiliary upper electrode 106c which is the same film as the lower electrode 121 of the electroluminescent unit EU, and the lateral side of the auxiliary upper electrode 106c may be covered by the organic surface portion Os1. In this case, the auxiliary upper electrode 106c may include a first conductive indium tin oxide film, a silver (Ag) film on the first conductive indium tin oxide film, and a second conductive indium tin oxide film on the silver film.

As another example, the conductive multilayer may be a bus wire 109b which is the same film as the source electrode 105 or drain electrode 107 of the thin film transistor TFT, and the lateral side of the bus wire 109b may be covered by the organic surface portion Os2. The bus wire 109b may be the same film as the source electrode 105 or drain electrode 107 of the thin film transistor (PC-TFT). In this case, the bus wire 106b may include a first titanium (Ti) film, an aluminum (Al) film formed on the first titanium film, and a second titanium film formed on the aluminum film, or may include a first molybdenum (Mo) film, an aluminum film on the first molybdenum film, and a second molybdenum film on the aluminum film. As still another example, the conductive multilayer may be the same film as the gate electrode 103 of the thin film transistor located in the display area DA.

As described above, according to one or more example embodiments of the present invention, a display device having improved encapsulating characteristics may be provided.

Although the present invention has been described with reference to the example embodiments, those skilled in the art will recognize that various changes and modifications to the described example embodiments may be performed, all without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims, and their equivalents.

What is claimed is:

1. An electroluminescent device comprising:
   a lower structure having an emission area and a peripheral area surrounding the emission area, the lower structure comprising an inorganic insulating film, an insulation film located on the inorganic insulating film, and an electroluminescent unit, the electroluminescent unit comprising:
      a lower electrode on a top surface of the insulation film;
      an intermediate film on the lower electrode; and
      an upper electrode on the intermediate film; and
   a flexible encapsulation multilayer on the emission area and the peripheral area, flexible encapsulation multilayer comprising at least three layers,
   wherein the peripheral area comprises an inorganic surface portion substantially surrounding the emission area, located outside the upper electrode in a planar view, and comprising only one or more inorganic materials,
   wherein the flexible encapsulation multilayer comprises a lower surface comprising only one or more inorganic materials,
   wherein the entire inorganic surface portion directly contacts the lower surface of the flexible encapsulation multilayer,
   wherein the lower structure further comprises a lower encapsulation inorganic film horizontally expanding under a surface of the lower structure to vertically correspond to the emission area and the peripheral area, and a portion between the lower encapsulation inorganic film and the entire inorganic surface portion comprises only one or more inorganic materials,
   wherein the inorganic surface portion comprises a first region having a first average width and a second region having a second average width, the first average width and the second average width being substantially different from each other,
   wherein the entire inorganic surface portion is substantially lower than the top surface of the insulation film,
   wherein the inorganic surface portion has at least a region comprising a plurality of inorganic surface branches spaced from each other,
   wherein the peripheral area comprises an organic surface portion between the inorganic surface branches, comprising an organic material, substantially surrounding the emission area, and being substantially surrounded in a planar view by an interface at where the lower surface of the flexible encapsulation multilayer directly contacts the inorganic surface portion,
   wherein the inorganic surface branches comprise an outer inorganic surface branch located substantially outer than the organic surface portion and an inner inorganic surface branch located substantially inner than the organic surface portion, wherein the lower structure further comprises a bus wire extending on a top surface of the inorganic insulating film along a periphery of the emission area and an auxiliary upper electrode extending on side and top surfaces of the insulation film along the periphery of the emission area, having a bottom surface electrically facing a top surface of the bus wire to electrically communicate with the top surface of the bus wire, and having a top surface electrically facing a bottom surface of the upper electrode to electrically communicate with the bottom surface of the upper electrode, wherein the inner inorganic surface branch comprises at least a portion of a top surface of the auxiliary upper electrode having a height substantially larger than a height of the outer inorganic surface branch, wherein a portion of a surface of the bus wire directly contacts the lower surface of the flexible encapsulation multilayer, the portion of the surface of the bus wire being substantially farther than the organic surface portion from the emission area, and wherein the lower encapsulation inorganic film has a hole filled with an inorganic material substantially different from that of the lower encapsulation inorganic film.

2. The electroluminescent device of claim 1, wherein the electroluminescent device is configured to be flexed, bent, folded, rolled, or stretched by an end user.

3. The electroluminescent device of claim 1, wherein the first region and the second region are located at a same side of the lower structure.

4. The electroluminescent device of claim 3, wherein the electroluminescent device is configured to be flexed, bent, folded, rolled, or stretched by an end user.

5. The electroluminescent device of claim 1, wherein the first region of the inorganic surface portion entirely corresponds to a first side of the lower structure, and wherein the second region of the inorganic surface portion entirely corresponds to a second side of the lower structure different from the first side of the lower structure.

6. The electroluminescent device of claim 5, wherein the electroluminescent device is configured to be flexed, bent, folded, rolled, or stretched by an end user.

7. The electroluminescent device of claim 5, wherein the first region has a first part having a third average width substantially smaller than the first average width and a second part having a fourth average width substantially larger than the first average width.

8. The electroluminescent device of claim 7, wherein the electroluminescent device is configured to be flexed, bent, folded, rolled, or stretched by an end user.

9. The electroluminescent device of claim 1, wherein the inorganic surface portion comprises a plurality of stepped surface portions each comprising a top surface portion of the inorganic insulating film, a side surface portion of the bus wire, and a top surface portion of the bus wire, and wherein the bus wire has an outer edge portion and an inner edge portion substantially opposite to the outer edge portion, the outer edge portion of the bus wire being substantially farther than the inner edge portion of the bus wire from the emission area, the outer edge portion of the bus wire being located under the bottom surface of the flexible encapsulation multilayer, and the outer edge portion of the bus wire being not in direct contact with the bottom surface of the flexible encapsulation multilayer.

10. The electroluminescent device of claim 9, wherein the electroluminescent device is configured to be flexed, bent, folded, rolled, or stretched by an end user.

11. The electroluminescent device of claim 9, wherein the inorganic surface portion further comprises a plurality of stepped surface portions each comprising a top surface portion of the inorganic insulating film, a side surface portion of the auxiliary upper electrode, and a top surface portion of the auxiliary upper electrode, and wherein the auxiliary upper electrode has an outer edge portion and an inner edge portion substantially opposite to the outer edge portion, the outer edge portion of the auxiliary upper electrode being substantially farther than the inner edge portion of the auxiliary upper electrode from the emission area, the outer edge portion of the auxiliary upper electrode being located under the bottom surface of the flexible encapsulation multilayer, and the outer edge portion of the auxiliary upper electrode being not in direct contact with the bottom surface of the flexible encapsulation multilayer.

12. The electroluminescent device of claim 11, wherein the electroluminescent device is configured to be flexed, bent, folded, rolled, or stretched by an end user.

13. The electroluminescent device of claim 9, wherein the inorganic surface portion further comprises a plurality of stepped surface portions each comprising a top surface portion of the bus wire, a side surface portion of the auxiliary upper electrode, and a top surface portion of the auxiliary upper electrode, and wherein the auxiliary upper electrode has an outer edge portion and an inner edge portion substantially opposite to the outer edge portion, the outer edge portion of the auxiliary upper electrode being substantially farther than the inner edge portion of the auxiliary upper electrode from the emission area, the outer edge portion of the auxiliary upper electrode being located under the bottom surface of the flexible encapsulation multilayer, and the outer edge portion of the auxiliary upper electrode being not in direct contact with the bottom surface of the flexible encapsulation multilayer.

14. The electroluminescent device of claim 13, wherein the electroluminescent device is configured to be flexed, bent, folded, rolled, or stretched by an end user.

15. The electroluminescent device of claim 9, wherein the inorganic surface portion further comprises a plurality of stepped surface portions each comprising a top surface portion of the inorganic insulating film, a side surface portion of the auxiliary upper electrode, and a top surface portion of the auxiliary upper electrode, wherein the inorganic surface portion further comprises a plurality of stepped surface portions each comprising a top surface portion of the bus wire, a side surface portion of the auxiliary upper electrode, and a top surface portion of the auxiliary upper electrode, and wherein the auxiliary upper electrode has an outer edge portion and an inner edge portion substantially opposite to the outer edge portion, the outer edge portion of the auxiliary upper electrode being substantially farther than the inner edge portion of the auxiliary upper electrode from the emission area, the outer edge portion of the auxiliary upper electrode being located under the bottom surface of the flexible encapsulation multilayer, and the outer edge portion of the auxiliary upper electrode being not in direct contact with the bottom surface of the flexible encapsulation multilayer.

16. The electroluminescent device of claim 15, wherein the electroluminescent device is configured to be flexed, bent, folded, rolled, or stretched by an end user.

17. The electroluminescent device of claim 1, wherein the portion of the surface of the bus wire, the portion directly contacting the lower surface of the flexible encapsulation multilayer, is at least a portion of the outer inorganic surface branch.

18. The electroluminescent device of claim 17, wherein the electroluminescent device is configured to be flexed, bent, folded, rolled, or stretched by an end user.

19. The electroluminescent device of claim 1, wherein the organic surface portion has a shape opened by an opening to discontinuously surround the emission area,
   wherein the first region of the inorganic surface portion entirely corresponds to a first side of the lower structure at where the opening is arranged,
   wherein the second region of the inorganic surface portion entirely corresponds to a second side of the lower structure at where the opening is not arranged, and
   wherein the first average width of the first region is substantially larger than the second average width of the second region.

20. The electroluminescent device of claim 19, wherein the electroluminescent device is configured to be flexed, bent, folded, rolled, or stretched by an end user.

21. An electroluminescent device comprising:
   a lower structure having an emission area and a peripheral area surrounding the emission area, the lower structure comprising an inorganic insulating film, an insulation film located on the inorganic insulating film, and an electroluminescent unit, the electroluminescent unit comprising:
      a lower electrode on a top surface of the insulation film;
      an intermediate film on the lower electrode; and
      an upper electrode on the intermediate film; and
   a flexible encapsulation multilayer on the emission area and the peripheral area, the flexible encapsulation multilayer comprising at least three layers,
   wherein the peripheral area comprises an inorganic surface portion substantially surrounding the emission area, located outside the upper electrode in a planar view, and comprising only one or more inorganic materials,
   wherein the flexible encapsulation multilayer comprises a lower surface comprising only one or more inorganic materials,
   wherein the entire inorganic surface portion directly contacts the lower surface of the flexible encapsulation multilayer,
   wherein the lower structure comprises a lower encapsulation inorganic film horizontally expanding under a surface of the lower structure to vertically correspond to the emission area and the peripheral area, and a portion between the lower encapsulation inorganic film and the entire inorganic surface portion comprises only one or more inorganic materials,
   wherein the peripheral area comprises an inorganic structure having an edge having a lateral surface and an upper surface,
   wherein the inorganic surface portion comprises the lateral and upper surfaces of the edge,
   wherein the lateral and upper surfaces of the edge directly contact the flexible encapsulation multilayer,
   wherein the edge extends from an outer edge of the inorganic surface portion to an inner edge of the inorganic surface portion located substantially opposite to the outer edge of the inorganic surface portion,
   wherein the lateral surface of the edge comprises a plurality of portions independently selected from the group consisting of a convex portion, a concave portion, an angled portion, a curved portion, and a portion extending substantially along a direction in which the inorganic surface portion extends,
   wherein the entire inorganic surface portion is substantially lower than the top surface of the insulation film,
   wherein the inorganic surface portion has at least a region comprising a plurality of inorganic surface branches spaced from each other,
   wherein the peripheral area comprises an organic surface portion between the inorganic surface branches, comprising an organic material, substantially surrounding the emission area, and being substantially surrounded in a planar view by an interface at where the lower surface of the flexible encapsulation multilayer directly contacts the inorganic surface portion,
   wherein the inorganic surface branches comprise an outer inorganic surface branch located substantially outer than the organic surface portion and an inner inorganic surface branch located substantially inner than the organic surface portion,
   wherein the lower structure further comprises a bus wire extending on a top surface of the inorganic insulating film along a periphery of the emission area and an auxiliary upper electrode extending on side and top surfaces of the insulation film along the periphery of the emission area, having a bottom surface electrically facing a top surface of the bus wire to electrically communicate with the top surface of the bus wire, and having a top surface electrically facing a bottom surface of the upper electrode to electrically communicate with the bottom surface of the upper electrode,
   wherein the inner inorganic surface branch comprises at least a portion of a top surface of the auxiliary upper electrode to have a height substantially larger than a height of the outer inorganic surface branch, and
   wherein a portion of a surface of the bus wire directly contacts the lower surface of the flexible encapsulation multilayer, and the portion of the surface of the bus wire is substantially farther than the organic surface portion from the emission area.

22. The electroluminescent device of claim 21, wherein the electroluminescent device is configured to be flexed, bent, folded, rolled, or stretched by an end user.

23. The electroluminescent device of claim 21, wherein the inorganic structure comprises a first inorganic film and a second inorganic film on the first inorganic film, and
   wherein a hardness of the second inorganic film is substantially greater than a hardness of the first inorganic film.

24. The electroluminescent device of claim 23, wherein the electroluminescent device is configured to be flexed, bent, folded, rolled, or stretched by an end user.

25. An electroluminescent device comprising:
   a lower structure having an emission area and a peripheral area surrounding the emission area, the lower structure comprising an inorganic insulating film, an insulation film located on the inorganic insulating film, and an electroluminescent unit, the electroluminescent unit comprising:
      a lower electrode on a top surface of the insulation film;
      an intermediate film on the lower electrode; and
      an upper electrode on the intermediate film; and a flexible encapsulation multilayer on the emission area and the peripheral area, the flexible encapsulation multilayer comprising at least three layers, wherein the peripheral area comprises an inorganic surface portion substantially surrounding the emission area, located outside the upper electrode in a planar view, and comprising only one or more inorganic materials, wherein the flexible encapsulation multilayer comprises a lower surface comprising only one or more inorganic materials, wherein the entire inorganic surface portion directly contacts the lower surface of the flexible encapsulation multilayer, wherein the lower structure comprises a lower encapsulation inorganic film horizontally expanding under a surface of the lower structure to vertically correspond to the emission area and the peripheral area, and a portion between the lower encapsulation inorganic film and the entire inorganic surface portion comprises only one or more inorganic materials.

wherein the peripheral area comprises a conductive film providing the electroluminescent unit with an electrical signal, and having a hole penetrating the conductive film, the hole being located inward from an inner edge of the inorganic surface portion and being an alignment mark, wherein the conductive film is an auxiliary upper electrode extending along a periphery of the emission area, and having a top surface electrically facing a bottom surface of the upper electrode to electrically communicate with the bottom surface of the upper electrode, wherein the entire inorganic surface portion is substantially lower than the top surface of the insulation film, wherein the inorganic surface portion has at least a region comprising a plurality of inorganic surface branches spaced from each other, wherein the peripheral area comprises an organic surface portion arranged between the inorganic surface branches, comprising an organic material, substantially surrounding the emission area, and being substantially surrounded in a planar view by an interface at where the lower surface of the flexible encapsulation multilayer directly contacts the inorganic surface portion, wherein the inorganic surface branches comprise an outer inorganic surface branch located substantially outer than the organic surface portion and an inner inorganic surface branch located substantially inner than the organic surface portion, wherein the lower structure further comprises a bus wire extending on a top surface of the inorganic insulating film along a periphery of the emission area and an auxiliary upper electrode extending on side and top surfaces of the insulation film along the periphery of the emission area, having a bottom surface electrically facing a top surface of the bus wire to electrically communicate with the top surface of the bus wire, and having a top surface electrically facing a bottom surface of the upper electrode to electrically communicate with the bottom surface of the upper electrode, wherein the inner inorganic surface branch comprises at least a portion of a top surface of the auxiliary upper electrode to have a height substantially larger than a height of the outer inorganic surface branch, and wherein a portion of a surface of the bus wire directly contacts the lower surface of the flexible encapsulation multilayer, and the portion of the surface of the bus wire is substantially farther than the organic surface portion from the emission area.

26. The electroluminescent device of claim 25, wherein the electroluminescent device is configured to be flexed, bent, folded, rolled, or stretched by an end user.

27. An electroluminescent device comprising:
a lower structure having an emission area and a peripheral area surrounding the emission area, the lower structure comprising an inorganic insulating film, an insulation film located on the inorganic insulating film, and an electroluminescent unit, the electroluminescent unit comprising:
a lower electrode on a top surface of the insulation film;
an intermediate film on the lower electrode; and
an upper electrode on the intermediate film; and
a flexible encapsulation multilayer on the emission area and the peripheral area, flexible encapsulation multilayer comprising at least three layers, wherein the peripheral area comprises an inorganic surface portion substantially surrounding the emission area, located outside the upper electrode in a planar view, and comprising only one or more inorganic materials, wherein the flexible encapsulation multilayer comprises a lower surface comprising only one or more inorganic materials, wherein the entire inorganic surface portion directly contacts the lower surface of the flexible encapsulation multilayer, wherein the lower structure comprises a lower encapsulation inorganic film horizontally expanding under a surface of the lower structure to vertically correspond to the emission area and the peripheral area, and a portion between the lower encapsulation inorganic film and the entire inorganic surface portion comprises only one or more inorganic materials, wherein the inorganic surface portion has at least one recess, wherein the recess is a hole formed through a first inorganic layer on a second inorganic layer such that a top surface of the second inorganic layer is exposed through the hole and is a bottom surface of the recess, wherein the first inorganic layer comprises only one or more inorganic films, and the second inorganic layer comprises only one or more inorganic films, wherein the entire inorganic surface portion is substantially lower than the top surface of the insulation film, wherein the inorganic surface portion has a region comprising a plurality of inorganic surface branches spaced from each other, wherein the peripheral area comprises an organic surface portion arranged between the inorganic surface branches, comprising an organic material, substantially surrounding the emission area, and being substantially surrounded in a planar view by an interface at where the lower surface of the flexible encapsulation multilayer directly contacts the inorganic surface portion, wherein the inorganic surface branches comprise an outer inorganic surface branch located substantially outer than the organic surface portion and an inner inorganic surface branch located substantially inner than the organic surface portion, wherein the lower structure further comprises a bus wire extending on a top surface of the inorganic insulating film along a periphery of the emission area and an auxiliary upper electrode extending on side and top surfaces of the insulation film along the periphery of the emission area, having a bottom surface electrically facing a top surface of the bus wire to electrically communicate with the top surface of the bus wire, and having a top surface electrically facing a bottom surface of the upper electrode to electrically communicate with the bottom surface of the upper electrode, wherein the inner inorganic surface branch comprises at least a portion of a top surface of the auxiliary upper electrode to have a height substantially larger than a height of the outer inorganic surface branch, and wherein a portion of a surface of the bus wire directly contacts the lower surface of the flexible encapsulation multilayer, and the portion of the surface of the bus wire is substantially farther than the organic surface portion from the emission area.

28. The electroluminescent device of claim 27, wherein the recess has a protrusion having a height no more than a depth of the recess.

29. The electroluminescent device of claim 27, wherein a plurality of the recesses have substantially different shapes in a plan view.

* * * * *